US012567515B2

(12) United States Patent
Sawaki et al.

(10) Patent No.: US 12,567,515 B2
(45) Date of Patent: Mar. 3, 2026

(54) CONDUCTIVE FILM, TOUCH PANEL, PHOTOSENSITIVE RESIN COMPOSITION, AND METHOD OF MANUFACTURING CONDUCTIVE FILM

(71) Applicant: FUJIFILM Corporation, Tokyo (JP)

(72) Inventors: Daigo Sawaki, Kanagawa (JP); Kazuhiro Hasegawa, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 623 days.

(21) Appl. No.: 17/953,948

(22) Filed: Sep. 27, 2022

(65) Prior Publication Data

US 2023/0053715 A1 Feb. 23, 2023

Related U.S. Application Data

(63) Continuation of application No. PCT/JP2021/010279, filed on Mar. 15, 2021.

(30) Foreign Application Priority Data

Mar. 31, 2020 (JP) ................................ 2020-062998
Oct. 2, 2020 (JP) ................................ 2020-167834

(51) Int. Cl.

| | |
|---|---|
| ***C08F 2/46*** | (2006.01) |
| ***C08F 2/50*** | (2006.01) |
| ***C08F 292/00*** | (2006.01) |
| ***C08G 61/04*** | (2006.01) |
| ***G03F 7/027*** | (2006.01) |
| ***G06F 3/041*** | (2006.01) |
| ***G06F 3/044*** | (2006.01) |
| ***H01B 3/18*** | (2006.01) |
| ***H01B 5/14*** | (2006.01) |
| ***H01B 7/02*** | (2006.01) |
| ***H01B 7/08*** | (2006.01) |

(52) U.S. Cl.

CPC ............. *H01B 5/14* (2013.01); *C08F 292/00* (2013.01); *G03F 7/027* (2013.01); *G06F 3/0412* (2013.01); *G06F 3/0443* (2019.05); *G06F 3/0446* (2019.05); *H01B 3/18* (2013.01); *H01B 7/0225* (2013.01); *H01B 7/08* (2013.01); *G06F 2203/04103* (2013.01)

(58) Field of Classification Search

CPC .... C08F 220/28; C08F 292/00; C08F 292/06; H01B 5/14; H01B 3/18; H01B 7/0225; H01B 7/08; G06F 3/0443; G06F 3/0412; G06F 3/0445; G06F 3/0446; G06F 2203/04103; B03F 7/027; B03F 7/0047

USPC ...................... 522/71, 1, 189, 184, 6; 520/1

See application file for complete search history.

(56) References Cited

U.S. PATENT DOCUMENTS

2013/0328149 A1* 12/2013 Okaniwa .............. H10F 77/496
257/432
2015/0370379 A1 12/2015 Hayashi et al.
2017/0371452 A1 12/2017 Endo et al.

FOREIGN PATENT DOCUMENTS

| | | | |
|---|---|---|---|
| JP | 2004-331769 | A | 11/2004 |
| JP | 2008-250074 | A | 10/2008 |
| JP | 2011-171544 | A | 9/2011 |
| JP | 2011171544 | * | 9/2011 |
| JP | 2013-194156 | A | 9/2013 |
| JP | 2014-182436 | A | 9/2014 |
| JP | 2019-175226 | A | 10/2019 |
| WO | 2016/158085 | A1 | 10/2016 |

OTHER PUBLICATIONS

Hirayama et al, JP 2011171544 Machine Translation, Sep. 1, 2011 (Year: 2011).*
International Search Report Issued in PCT/JP2021/010279 on Apr. 27, 2021.
Written Opinion Issued in PCT/JP2021/010279 on Apr. 27, 2021.
International Preliminary Report on Patentability Issued in PCT/JP2021/010279 on Sep. 29, 2022.
Office Action, issued by the Japanese Patent Office on Apr. 11, 2023 in connection with Japanese Patent Application No. 2022-511787.

* cited by examiner

*Primary Examiner* — Jessica Whiteley
(74) *Attorney, Agent, or Firm* — Edwards Neils LLC; Jean C. Edwards, Esq.

(57) ABSTRACT

In a conductive film, a cured film formed of a photosensitive resin composition including at least one of monomers represented by Formulae (1) and (2), a clay mineral, and a photopolymerization initiator is provided as a protective layer of a lead-out wiring part of the conductive film that functions as a touch sensor.

15 Claims, 5 Drawing Sheets

CONDUCTIVE FILM, TOUCH PANEL, PHOTOSENSITIVE RESIN COMPOSITION, AND METHOD OF MANUFACTURING CONDUCTIVE FILM

CROSS-REFERENCE TO RELATED APPLICATIONS

This application is a Continuation of PCT International Application No. PCT/JP2021/010279 filed on Mar. 15, 2021, which was published under PCT Article 21 (2) in Japanese, and which claims priority under 35 U.S.C § 119 (a) to Japanese Patent Application No. 2020-062998 filed on Mar. 31, 2020, and Japanese Patent Application No. 2020-167834 filed on Oct. 2, 2020. The above applications are hereby expressly incorporated by reference, in their entirety, into the present application.

BACKGROUND OF THE INVENTION

1. Field of the Invention

The present invention relates to a conductive film that functions as a touch sensor where durability of a metal wire to sulfur or halogen in an environment or to iodine eluted from a polarizing plate is excellent and a reduction in thickness and flexibility are achieved, and a photosensitive resin composition that can be used for a wire protective layer of a touch panel and a conductive film.

2. Description of the Related Art

Currently, in various electronic apparatuses including a portable information apparatus such as a tablet computer or a smartphone, a touch panel is used in combination with a display device such as a liquid crystal display device or an organic EL display device and performs an input operation on an electronic apparatus in a case where a screen is touched. The touch panel includes a touch sensor including: a detection electrode that detects a touch; and a lead-out wiring that is connected to the detection electrode.

The lead-out wiring leads out an electrical signal from the detection electrode, and is routed around the detection electrode and disposed up to a position connected to a flexible print substrate (FPC). In the connecting part to the FPC, the FPC and the lead-out wiring are electrically connected, and the FPC is connected to an integrated circuit (IC) that controls the touch sensor through the FPC. As a result, the touch sensor can be driven.

Recently, a reduction in thickness and frame narrowing of the touch panel have progressed. The battery capacity of an electronic apparatus can be increased by reducing the thickness of the touch panel, the area of the touch panel required for screen display can be widened by frame narrowing. Therefore, the actual screen size increases, and a design having high designability is achieved.

On the other hand, due to the frame narrowing of the touch panel, an interval between lead-out wirings is narrowed, and there is a problem in that migration is likely to occur. JP2014-182436A discloses that a protective layer including an epoxy resin is provided on a lead-out wiring in order to suppress migration.

JP2004-331769A describes an actinic ray-curable resin composition including talc as an insulator having excellent adhesiveness with a transparent electrode or the like of a touch panel.

Further, for example, WO2016/158085A describes that a wiring is bent using a flexible substrate for frame narrowing.

WO2016/158085A describes a touch sensor including: one substrate having a plurality of regions that includes at least a planar region and a side surface region which is continuous to the planar region and is bent with respect to the planar region; a touch sensor unit provided in the planar region of the substrate; and an antenna provided in a region of the substrate other than the planar region. The substrate is formed of a flexible transparent substrate, the touch sensor unit includes a detection unit and a peripheral wiring unit, and at least the detection unit is formed of a fine metal wire.

SUMMARY OF THE INVENTION

In order to reduce the thickness of the touch panel, it is required that the thicknesses of an optically clear adhesive (OCA) and an optically clear resin (OCR) such as an ultraviolet (UV)-curable resin as transparent insulation layers that bond members forming the touch panel are also small and a conductive film does not have a large protrusion portion to prevent deterioration in step followability.

In addition, regarding the lead-out wiring of the touch panel, it is necessary to reduce not only the interval between wirings but also the line width for frame narrowing. In a case where the line width of the lead-out wirings is reduced, the probability of disconnection caused by corrosion of the wiring by sulfur, halogen, or the like in an external environment increases. In particular, in a touch panel combined with a liquid crystal display device or an organic EL display device, it was found that iodine in a polarizing plate of the display device accelerates disconnection of the lead-out wiring.

Further, for the frame narrowing of the touch panel, an attempt to bent a wiring part along a frame portion of the display device has been made, but the thickness of the display device itself has also been reduced. Therefore, in a case where the wire part is bent along the frame portion of the display device, bending at a curvature radius of 2 mm or less is required.

In JP2014-182436A, the water permeability of a resin used for the protective layer is high, and disconnection of the lead-out wiring cannot be suppressed. Further, in a case where the thickness of the protective layer increases to suppress disconnection, the thickness of the touch panel increases, and it is difficult to bent the wiring part for frame narrowing as described in WO2016/158085A.

In addition, as described above, JP2004-331769A describes that the resin composition having excellent adhesiveness is applied to the lead-out wiring. However, in a region where the thickness of the resin layer is small, this configuration is insufficient for protecting the lead-out wiring of the touch panel from sulfur or halogen (in particular, iodine).

An object of the present invention is to solve the problems based on the related art and to provide: a conductive film that suppresses disconnection of a metal wire even in a case where the thickness of a metal wire protective layer is small and can bent a wiring part at a very small curvature; and a touch panel including the conductive film. In addition, another object of the present invention is to provide a photosensitive resin composition for manufacturing the conductive film and a method of manufacturing the photosensitive resin composition.

As a result of conducting a thorough experiment and research to achieve the above-described objects, the present inventors found that the above-described objects can be achieved with the following configurations.

According to an aspect of the present invention, there is provided a conductive film comprising: a metal wiring part that is provided on at least one surface of a transparent flexible substrate, in which at least a part of the wiring part is covered with a protective layer having a thickness (t) of 15 μm or less obtained by curing a photosensitive resin composition including a resin forming component that includes at least one of (meth)acrylate monomers represented by Formulae (1) and (2), a clay mineral, and a photopolymerization initiator, an average particle diameter ($D_{ave}$) of the clay mineral is ⅕ to ½ the thickness (t) of the protective layer and an average aspect ratio of the clay mineral is 2.0 or more, a proportion of the clay mineral having a particle diameter that is more than or equal to the thickness (t) is 0.5 vol % or less, and a proportion of the clay mineral in the photosensitive resin composition is 5 to 50 mass %.

Formula (1)

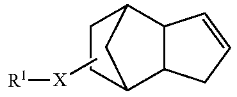

Formula (2)

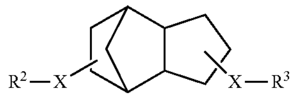

$R^1$ and $R^2$ each independently represent a (meth)acryloyl group, $R^3$ represents an unsubstituted or (meth)acryloyl group, and X represents a single bond or a divalent linking group represented by Formula (3))

$$-Y^1-R^4-Y^2- \quad \text{Formula (3)}$$

(Here, $R^4$ represents an alkylene group having 3 or less carbon atoms, and $Y^1$ and $Y^2$ each independently represent an oxygen atom or a single bond).

It is preferable that the average particle diameter of the clay mineral is less than 2.5 μm, and the thickness (t) of the protective layer is 8 μm or less.

It is preferable that a content of the clay mineral in the photosensitive resin composition is 10 to 30 mass %.

It is preferable that the clay mineral is a talc that is surface-modified with a silane coupling agent having a functional group crosslinkable with the resin forming component.

It is preferable that the functional group is at least one selected from the group consisting of a (meth)acryloyl group, a vinyl group, an epoxy group, a styryl group, an amino group, a mercapto group, and an isocyanate group.

It is preferable that the resin component further includes an oligomer and/or a polymer.

It is preferable that the oligomer and the polymer are (meth)acrylates.

In addition, according to another aspect of the present invention, there is provided a conductive film comprising: a wiring part that is provided on at least one surface of a transparent flexible substrate and is formed of a metal conductive layer, in which a protective layer having a thickness (t) of 15 μm or less and including a resin component having a dicyclopentenyl structure or a tricyclodecane structure and a clay mineral is laminated on at least a part of the wiring part, an average particle diameter ($D_{ave}$) of the clay mineral is ½ or less of the thickness (t) and an average aspect ratio of the clay mineral is 2.0 or more, a proportion of the clay mineral having a particle diameter that is more than or equal to the thickness (t) is 0.5 vol % or less, and a proportion of the clay mineral in the protective layer is 5 to 50 mass %.

According to still another aspect of the present invention, there is provided a touch panel comprising, in the following order: an image display module; the above-described conductive film; and a cover portion, in which the conductive film is disposed on a display surface side of the image display module, and a polarizing plate is further disposed at at least any one of a position between the image display module and the conductive film or a position between the conductive film and the cover portion.

It is preferable that at least a part of the wiring part is bent along a frame portion of the image display module.

In addition, according to still another aspect of the present invention, there is provided a photosensitive resin composition comprising: a resin forming component that includes at least one of (meth)acrylate monomers represented by Formulae (1) and (2); a clay mineral that has an average particle diameter of 7.5 μm or less and an average aspect ratio of 2.0 or more and is surface-modified with a silane coupling agent having a functional group crosslinkable with the resin forming component; and a photopolymerization initiator, in which a viscosity of the photosensitive resin composition is 5000 mPa·s or higher, and a proportion of the clay mineral in the photosensitive resin composition is 5 to 50 mass %.

Formula (1)

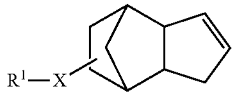

Formula (2)

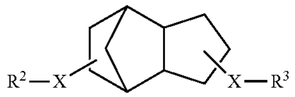

$R^1$ and $R^2$ each independently represent a (meth)acryloyl group, $R^3$ represents an unsubstituted or (meth)acryloyl group, and X represents a single bond or a divalent linking group represented by Formula (3))

$$-Y^1-R^4-Y^2- \quad \text{Formula (3)}$$

(Here, $R^4$ represents an alkylene group having 3 or less carbon atoms, and $Y^1$ and $Y^2$ each independently represent an oxygen atom or a single bond).

In addition, according to still another aspect of the present invention, there is provided a method of manufacturing a conductive film, comprising: a step of forming a wiring part consisting of a metal conductive layer on at least one surface of a transparent flexible substrate; a step of determining a design thickness of a protective layer to be 15 μm or less such that at least a part of the fine metal wire is covered with the protective layer; a step of applying a photosensitive resin composition including a resin forming component, a clay mineral, and a photopolymerization initiator to at least a part of the fine metal wire, the resin forming component including at least one of (meth)acrylate monomers represented by Formulae (1) and (2), and the clay mineral having a configuration where an average particle diameter is ⅕ to ½ the design thickness, a proportion of the clay mineral having a particle diameter of the design thickness or more is 0.5 vol % or less, and an average aspect ratio is 2.0 or more; and a step of curing the photosensitive resin composition to form the protective layer having the same thickness as the design thickness, in which a proportion of the clay mineral in the photosensitive resin composition is 5 to 50 mass %, and a viscosity of the photosensitive resin composition is 5000 mPa·s or higher.

Formula (1)

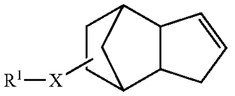

Formula (2)

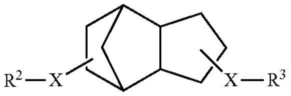

$R^1$ and $R^2$ each independently represent a (meth)acryloyl group, $R^3$ represents an unsubstituted or (meth)acryloyl group, and X represents a single bond or a divalent linking group represented by Formula (3))

$$-Y^1-R^4-Y^2- \quad \text{Formula (3)}$$

(Here, $R^4$ represents an alkylene group having 3 or less carbon atoms, and $Y^1$ and $Y^2$ each independently represent an oxygen atom or a single bond).

According to the aspects of the present invention, it is possible to provide a conductive film where disconnection of a metal wire can be suppressed and a wiring part of a conductive film can be bent, a touch panel, a photosensitive resin composition, and a method of manufacturing a conductive film.

DESCRIPTION OF THE PREFERRED EMBODIMENTS

Hereinafter, a conductive film, a touch panel, and a photosensitive resin composition according to an embodiment of the present invention will be described in detail.

The drawings described below are exemplary drawings for describing the present invention, and the present invention is not limited to the drawings described below.

In the following description, a numerical range indicated by the expression "to" includes numerical values described on both sides. For example, in a case where e is a numerical value $\alpha$ to a numerical value $\beta$, the range $\varepsilon$ is a range including the numerical value $\alpha$ and the numerical value $\beta$, which is expressed by a mathematical symbol $\alpha \leq \varepsilon \leq \beta$.

Unless specified otherwise, the meaning of an angle such as "parallel" or "perpendicular" includes a case where an error range is generally allowable in the technical field.

In addition, the meaning of "the same" includes a case where an error range is generally allowable in the technical field.

In addition, light denotes an actinic ray or radiation. In the present specification, unless specified otherwise, "exposure" denotes not only exposure using a bright light spectrum of a mercury lamp, a far ultraviolet ray represented by excimer laser, an X-ray, an EUV ray, or the like but also drawing using a particle beam such as an electron beam or an ion beam.

In this specification, "(meth)acrylate" denotes either or both of acrylate and methacrylate, and "(meth)acryl" denotes either or both of acryl and methacryl. In addition, "(meth)acryloyl" denotes either or both of acryloyl and methacryloyl.

Unless specified otherwise, "transparent" represents that a light transmittance in a visible wavelength range of 380 to 780 nm is 40% or more, preferably 80% or more, and more preferably 90% or more.

The light transmittance is measured using "Plastics—Determination of Total Luminous Transmittance and Reflectance" defined by Japanese Industrial Standards (JIS) K 7375:2008.

(Touch Panel)

Figure 1:
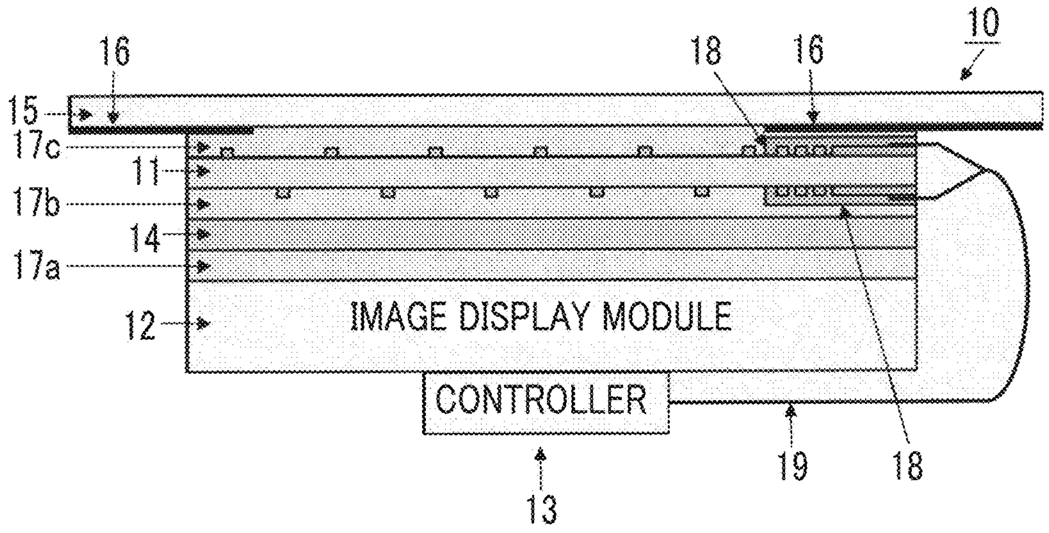
FIG. 1 is a schematic cross-sectional view showing a first example of a touch panel according to an embodiment of the present invention.

FIG. 1 is a schematic cross-sectional view showing a touch panel according to a first example of the embodiment of the present invention.

In a touch panel 10 according to the first example, an image display module 12, a first transparent insulation layer 17*a*, a polarizing plate 14, a second transparent insulation layer 17*b*, a conductive film 11, a third transparent insulation layer 17*c*, and a cover portion 15 are laminated in this order, and the conductive film 11 is disposed on a display surface side of the image display module 12.

In the touch panel 10, a front surface of the cover portion 15 is a touch surface of the touch panel 10, which functions as an operation surface. The touch panel 10 performs an input operation on a front surface of the cover portion 16 as an operation surface. The touch surface is a surface that detects a touch of a finger, a stylus pen, or the like. The front surface of the cover portion 16 is a visible surface of a display object (not shown) that is displayed on the display surface of the image display module 12.

A controller 13 is provided on a rear surface of the image display module 12. A flexible circuit board 19 connected to the conductive film 11 is bent to surround a side surface of the image display module 12. The conductive film 11 and the controller 13 are electrically connected through the flexible circuit board 19.

Figure 2:
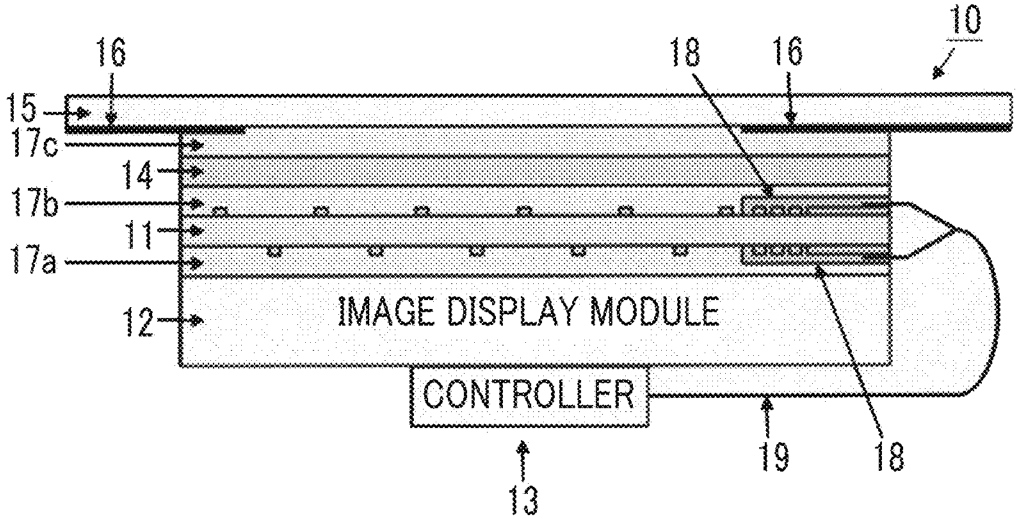
FIG. 2 is a schematic cross-sectional view showing a second example of the touch panel according to the embodiment of the present invention.

FIG. 2 is a schematic cross-sectional view showing a touch panel according to a second example of the embodiment of the present invention.

In the touch panel according to the second example, the image display module 12, the first transparent insulation layer 17*a*, the conductive film 11, the second transparent insulation layer 17*b*, the polarizing plate 14, the third transparent insulation layer 17*c*, and the cover portion 15 are laminated in this order, and the conductive film 11 is disposed on the display surface side of the image display module 12.

Figure 3:
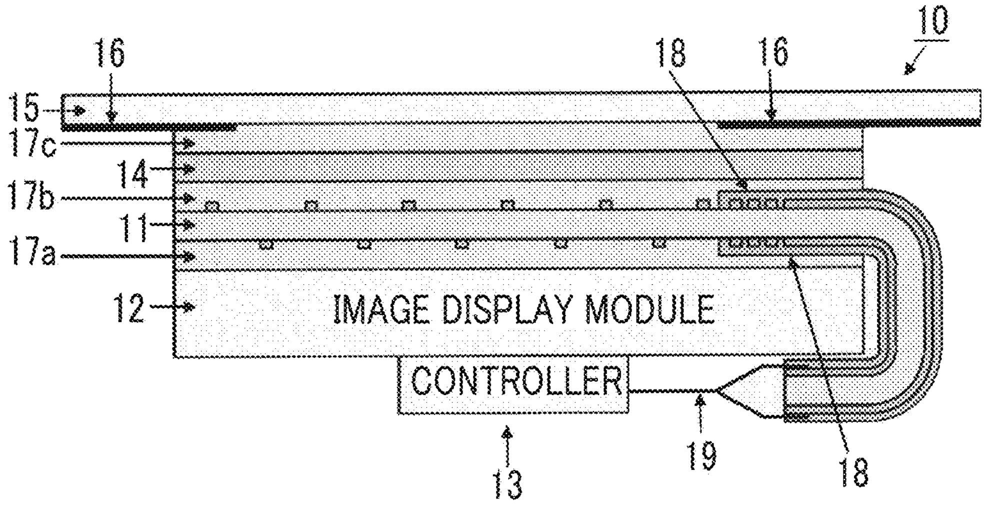
FIG. 3 is a schematic cross-sectional view showing a third example of the touch panel according to the embodiment of the present invention.

FIG. 3 is a schematic cross-sectional view showing a touch panel according to a third example of the embodiment of the present invention.

In the touch panel according to the third example, the image display module 12, the first transparent insulation layer 17*a*, the polarizing plate 14, the second transparent insulation layer 17*b*, the conductive film 11, the third transparent insulation layer 17*c*, and the cover portion 15 are laminated in this order, and the conductive film is laminated on the display surface side of the image display module 12.

The controller 13 is provided on the rear surface of the image display module 12. The conductive film 11 is bent to surround the side surface of the image display module 12. The conductive film 11 and the controller 13 are electrically connected through the flexible circuit board 19. The conductive film 11 and the flexible circuit board 19 are connected through a rear surface of the image display module.

In a configuration of a typical touch panel, as in the configuration of the touch panel 10 in FIGS. 1 to 3, the conductive film 11 and the polarizing plate 14 are disposed adjacent to each other and approach each other as the thickness of the touch panel decreases. In a case where the touch panel is used in an environment of high humidity or a large difference in air temperature, it was found that dew condensation often occurs around the touch panel, iodine is eluted from the polarizing plate 14, and corrosion of a metal wire of the conductive film 11 is accelerated.

Further, along with the frame narrowing of the touch panel, in the configuration as in FIG. 3 where the wiring part is bent along the frame portion of the image display module, stress is applied to the wiring part, the wiring part is exposed, and corrosion of a metal wire by sulfur, halogen, or the like in an external environment is further accelerated.

The image display module 12 has a display surface that displays a display object such as an image. For example, a liquid crystal display device, an organic electroluminescence (organic EL) display device, a cathode ray tube (CRT) display device, a vacuum fluorescent display (VFD), a plasma display panel (PDP), a surface-conduction electron-emitter display (SED), a field emission display (FED), or an electronic paper can be used.

In order to reduce the thickness of the touch panel 10, it is preferable to adopt the form of a panel such as a liquid crystal display panel or an organic EL panel.

(Conductive Film)

<Configuration of Conductive Film>

The conductive film 11 will be described.

Figure 4:
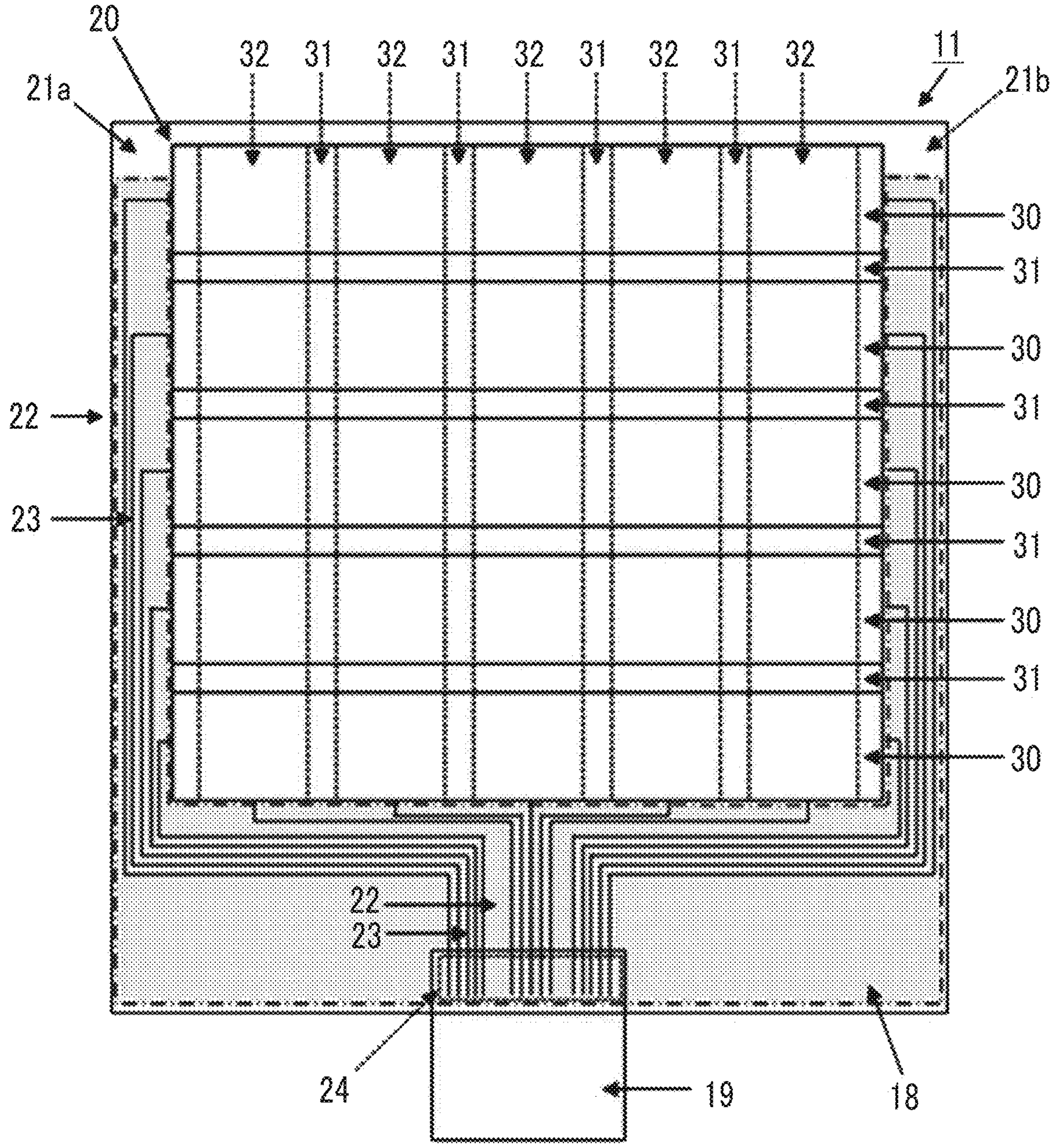
FIG. 4 is a schematic diagram showing a first example of a conductive film according to the embodiment of the present invention.
Figure 5:
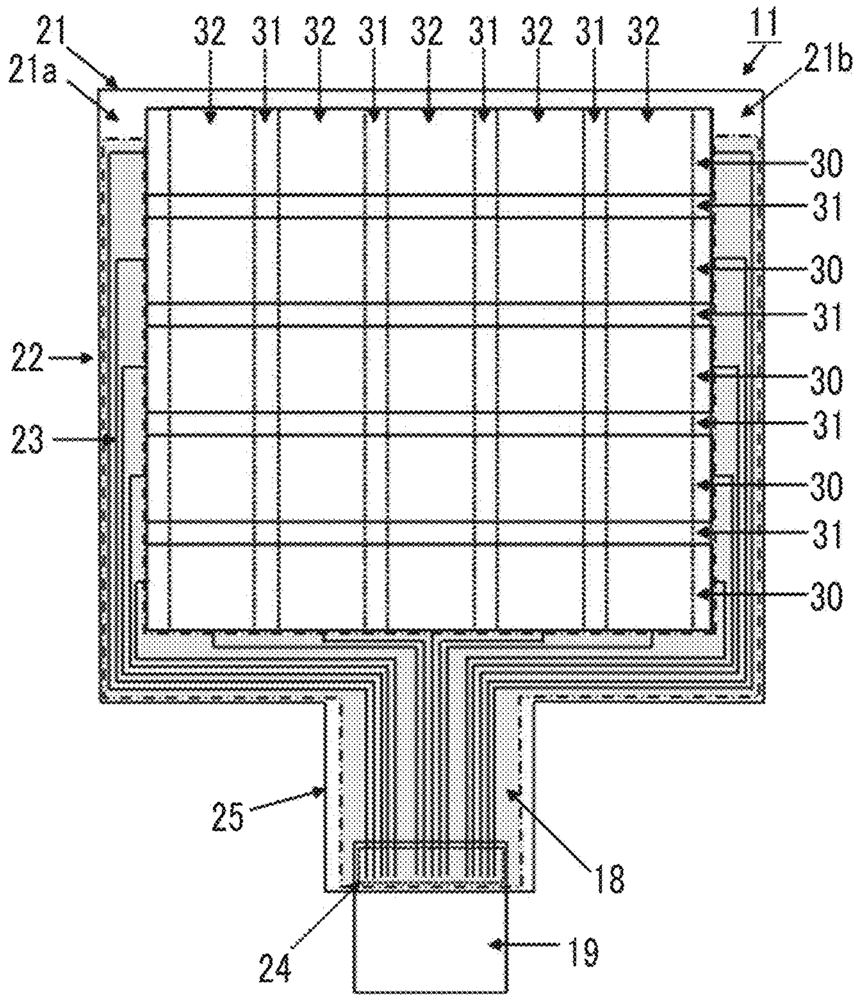
FIG. 5 is a schematic diagram showing a second example of the conductive film according to the embodiment of the present invention.

FIGS. 4 and 5 are schematic diagrams showing examples of the conductive film according to the embodiment of the present invention. In the configuration of the conductive film 11 shown in FIG. 4, the flexible circuit board 19 is bent instead of bending the conductive film 11. On the other hand, in the configuration of the conductive film 11 shown in FIG. 5, a bending portion 25 extending from one end of the conductive film 11 is bent.

The conductive film 11 functions as a touch sensor in the touch panel 10. The conductive film 11 is a conductive film having a metal wire (for example, a lead-out wiring 23) on a surface of a transparent flexible substrate 21, in which at least a part of the metal wire is covered with a protective layer 18 having a thickness of 8 μm or less.

For example, the conductive film 11 includes, on at least one surface of the transparent flexible substrate 21, a detection unit 20 that is formed of a conductive layer and a lead-out wiring part 22 where one end is electrically connected to the detection unit 20 and another end is connected to an external connection terminal 26. In the conductive film 11, the detection unit 20 and the lead-out wiring part 22 are provided on each of a front surface 21*a* and a rear surface 21*b* of the flexible substrate 21.

The detection unit 20 is an input region where an input operation can be performed by a user. The lead-out wiring part 22 is disposed on an outside region positioned outside of the input region. The input region of the detection unit 20 will be referred to as "active area", and the outside region of the input region will be referred to as "inactive area".

At least a part of the surface of the lead-out wiring part 22 is covered with the protective layer 18 to suppress corrosion by sulfur or halogen in an external environment or iodine eluted from the polarizing plate. From the viewpoint of suppressing the corrosion, it is preferable that the lead-out wiring part 22 is completely covered.

The detection unit 20 includes, for example, a plurality of first detection electrodes 30 and a plurality of second detection electrodes 32. The plurality of first detection electrodes 30 are belt-shaped electrodes extending parallel to each other in an X direction, and are provided on the front surface 21*a* (refer to FIG. 4) of the flexible substrate 21 at intervals 31 in a Y direction perpendicular to the X direction in a state where they are electrically insulated from each other in the Y direction. The plurality of second detection electrodes 32 are belt-shaped electrodes extending parallel to each other in the Y direction, and are provided on the rear surface 21*b* (refer to FIG. 4) of the flexible substrate 21 at the intervals 31 in a X direction in a state where they are electrically insulated from each other in the X direction. The plurality of first detection electrodes 30 and the plurality of second detection electrodes 32 are provided perpendicular to each other and are electrically insulated from each other by the flexible substrate 21.

The intervals 31 of the first detection electrodes 30 and the second detection electrodes 32 are regions that divide and are not electrically connected to the first detection electrodes 30 or the second detection electrodes 32. Therefore, as described above, the plurality of first detection electrodes 30 are electrically insulated from each other in the Y direction, and the plurality of second detection electrodes 32 are electrically insulated from each other in the X direction.

In the detection unit 20, as shown in FIG. 4, five first detection electrodes 30 and five second detection electrodes 32 are provided. However, the numbers of the first detection electrodes 30 and the second detection electrodes 32 are not particularly limited and only need to be plural.

Figure 7:
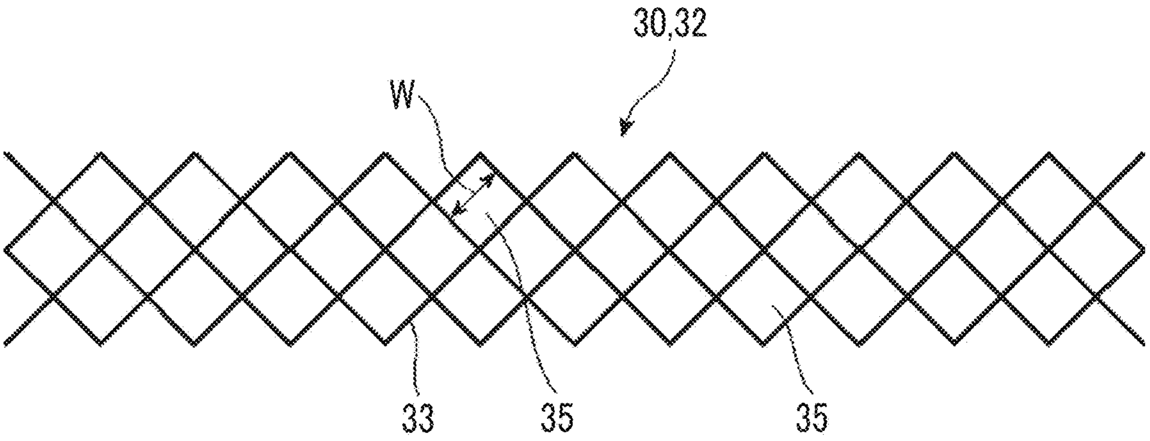
FIG. 7 is a schematic diagram showing an electrode configuration of the detection unit of the conductive film in the touch panel according to the embodiment of the present invention.

The first detection electrodes 30 and the second detection electrodes 32 are formed of, for example, fine metal wires 33 (refer to FIG. 7). The fine metal wires 33 are arranged, for example, in a mesh pattern shape. The pattern of the fine metal wires 33 will be described below in detail. Both of the first detection electrodes 30 and the second detection electrodes 32 correspond to the conductive layers.

The lead-out wiring part 22 is a member for applying a voltage to the first detection electrodes 30 and the second detection electrodes 32. One end of the lead-out wiring part 22 is electrically connected to the first detection electrodes 30 or the second detection electrodes 32. An external connection terminal 24 is provided at a terminal portion as another end of the lead-out wiring part 22.

The lead-out wiring part 22 is formed of a plurality of lead-out wirings 23. One end of each of the lead-out wirings 23 is electrically connected to the first detection electrode 30 or the second detection electrode 32. Other ends of the lead-out wirings 23 are collectively electrically connected to one external connection terminal 24. The other ends of the plurality of lead-out wirings 23 are the terminal portion of the lead-out wiring part 22.

The number of the lead-out wirings 23 in the lead-out wiring part 22 is the same as the number of the detection electrodes that are electrically connected.

In the touch panel 10 shown in FIG. 4, the lead-out wiring part 22 is electrically connected to one ends of the first detection electrodes 30 in the X direction, the lead-out wiring part 22 is electrically connected to one ends of the second detection electrode 32 in the Y direction, and the lead-out wiring part 22 is routed in three directions with respect to the first detection electrodes 30 and the second detection electrodes 32.

It is preferable that the detection unit 20 and the lead-out wiring part 22 are integrally configured. In this case, the detection unit 20 and the lead-out wiring part 22 are formed, for example, using a lithography method.

Hereinafter, each of the members forming the conductive film will be described.

<Electrode Configuration and the Like>

Figure 8:
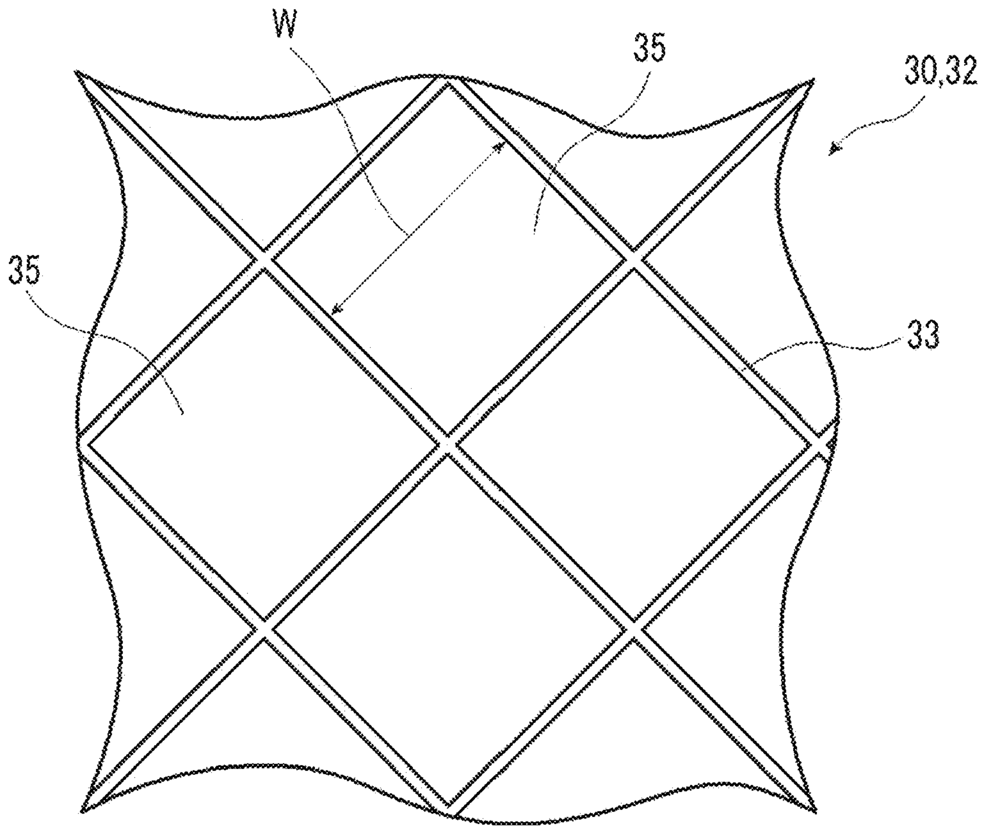
FIG. 8 is a schematic diagram showing an example of a shape of a mesh pattern of the detection unit of the conductive film in the touch panel according to the embodiment of the present invention.

FIG. 7 is a schematic diagram showing an electrode configuration of the detection unit of the conductive film according to the embodiment of the present invention. FIG. 8 is a schematic diagram showing an example of a shape of a mesh pattern of the detection unit of the conductive film in the touch panel according to the embodiment of the present invention.

The first detection electrodes 30 and the second detection electrodes 32 in the detection unit 20 are formed of the fine metal wires 33 as described above. The first detection electrodes 30 and the second detection electrodes 32 have a mesh pattern where the plurality of fine metal wires 33 intersect each other, for example, as shown in FIG. 7.

The lead-out wiring 23 can have the same configuration as the first detection electrode 30 and the second detection electrode 32. The lead-out wirings 23 are formed of the fine metal wires 33 having shapes of a straight line, a curve, or a combination thereof. The lead-out wirings 23 may have a mesh pattern where the plurality of fine metal wires 33 intersect each other.

In a case where the first detection electrodes 30, the second detection electrodes 32, and the lead-out wirings 23 are configured to have the mesh pattern, the pattern of the mesh pattern is not particularly limited and is preferably a triangle such as a regular triangle, an isosceles triangle, or a right triangle, a quadrangle such as a square, a rectangle, a rhomboid, a parallelogram, or a trapezoid, a regular n-polygon such as a (regular) hexagon or a (regular) octagon, a geometric figure as a combination of a circle, an ellipse, a star shape, and the like.

The mesh of the mesh pattern refers to a shape including a plurality of opening portions 35 formed by the fine metal wires 33 intersecting each other as shown in FIG. 8.

The opening portions 35 are open regions surrounded by the fine metal wires 33. Regarding one side length W of the opening portion 35, the upper limit is preferably 800 μm or less, more preferably 600 μm or less, and still more preferably 400 μm or less, and the lower limit is preferably 5 μm or more, more preferably 30 μm or more, and still more preferably 80 μm or more. In a case where the one side length W of the opening portion 35 is in the above-described range, transparency can also be maintained at a high level, and in a case where the conductive film 11 (refer to FIG. 1) is attached to the display surface of the image display module 12 (refer to FIG. 1), a display is visible without discomfort.

From the viewpoint of visible transmittance, the opening ratio of the mesh pattern is preferably 85% or more, more preferably 90% or more, and still more preferably 95% or more. The opening ratio corresponds to a proportion of transmitting portions (opening portions) excluding the fine metal wires in the region where the conductive layer is provided, that is, a proportion of the opening portions in the entire region where the conductive layer is provided.

Figure 6:
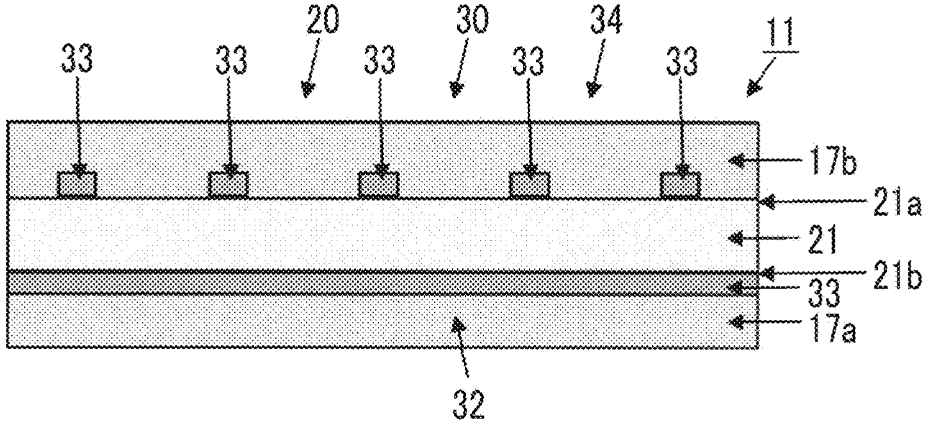
FIG. 6 is a schematic cross-sectional view showing a configuration of a detection unit in the conductive film according to the embodiment of the present invention.

In the detection unit 20, as shown in FIG. 6, the first detection electrodes 30 are provided on the front surface 21*a* of the flexible substrate 21, and the second detection electrodes 32 are provided on the rear surface 21*b* of the flexible substrate 21. However, the detection unit 20 is not limited to this configuration. For example, the first detection electrodes 30 and the second detection electrodes 32 may be laminated on separate flexible substrates. Specifically, the flexible substrate 21 where the first detection electrodes 30 are provided and the flexible substrate 21 where the second detection electrodes 32 are provided may be laminated through a transparent and electrically insulated insulator layer.

Figure 9:
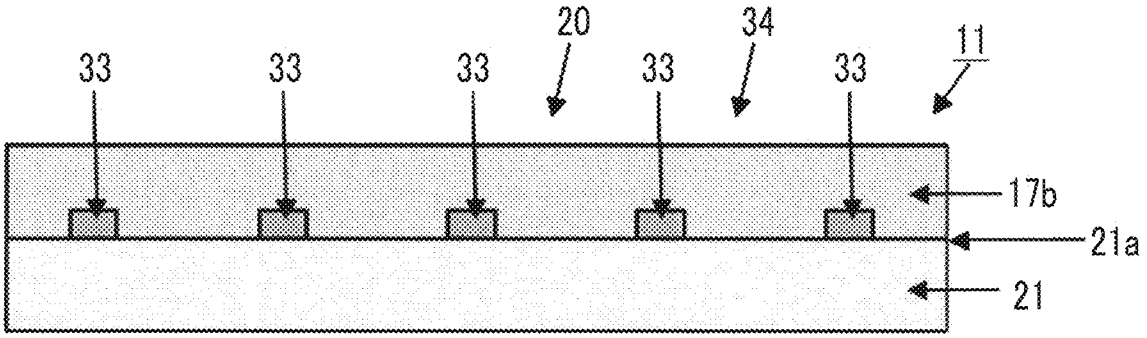
FIG. 9 is a schematic cross-sectional view showing an example of a configuration of the detection unit in the conductive film according to the embodiment of the present invention.

The present invention is not limited to the configuration where the detection unit 20 is provided on each of the front surface 21*a* and the rear surface 21*b* of the flexible substrate 21. As shown in FIG. 9, a detection electrode 34 may be provided on only one surface of the flexible substrate 21, for example, the front surface 21*a*. The detection electrode 34 shown in FIG. 9 functions as the detection unit 20. The detection electrode 34 is formed of a plurality of fine metal wires 33 as in the first detection electrode 30 (refer to FIG. 7), and the fine metal wires 33 are provided on the front surface 21*a*.

FIG. 9 is a schematic cross-sectional view showing an example of a configuration of the detection unit of the conductive film in the touch panel according to the embodiment of the present invention.

As a configuration other than the fine metal wires, the first detection electrodes 30 and the second detection electrodes 32 in the detection unit 20 may be formed of a conductive fiber such as silver nanowire, carbon nanotube (CNT), or carbon nanobud (CNB), may be formed of a conductive polymer such as indium tin oxide (ITO), or may be formed of a combination thereof.

<Flexible Substrate>

The flexible substrate refers to a substrate that can be bent, specifically, a substrate where breakage does not occur during bending at a curvature radius of 1 mm.

The flexible substrate is a flexible support that supports the detection unit and the lead-out wiring part. The kind of the flexible substrate is not particularly limited as long as it can support the detection unit and the lead-out wiring part and is flexible. A transparent support is preferable, and a plastic sheet is more preferable.

As a specific example of a material forming the flexible substrate, a plastic film having a melting point of about 290° C. or lower, for example, polyethylene terephthalate (PET) (258° C.), polycycloolefin (134° C.), polycarbonate (250° C.), a (meth)acrylic resin (128° C.), polyethylene naphthalate (PEN, 269° C.), polyethylene (PE, 135° C.), polypropylene (PP, 163° C.), polystyrene (230° C.), polyvinyl chloride (180° C.), polyvinylidene chloride (212° C.), polyvinylidene fluoride (PVDF, 177° C.), polyarylate (PAR, 250° C.), polyethersulfone (PES, 225° C.), a polymer acrylic resin, a fluorene derivative (140° C.), a crystalline COP (165° C.), or triacetyl cellulose (TAC, 290° C.) is preferable, and a (meth)acrylic resin, PET, polycycloolefin, or polycarbonate is more preferable. The numerical value in the brackets is the melting point or the glass transition temperature.

The total light transmittance of the flexible substrate is preferably 85% to 100%.

The thickness of the flexible substrate is not particularly limited and, typically, can be freely selected in a range of 25 to 500 μm can be selected from the viewpoint of application to the touch panel. For the frame narrowing of the touch panel, in a case where the conductive film is bent, the thickness of the flexible substrate is more preferably in a range of 25 to 50 μm. In a case where the flexible substrate also has a function of a touch surface in addition to the function of the flexible substrate, the flexible substrate can also be designed to have a thickness of more than 500 μm.

Examples of a preferable aspect of the flexible substrate include a treated support that undergoes at least one treatment selected from the group consisting of an atmospheric pressure plasma treatment, a corona discharge treatment, and an ultraviolet irradiation treatment. By performing the above-described treatment, a hydrophilic group such as an OH group is introduced into the treated surface of the support, and adhesiveness of the fine metal wires with the substrate is further improved.

In another preferable aspect of the flexible substrate, it is preferable that an undercoat layer including a polymer is provided on a surface of the flexible substrate. By forming the detection unit and the lead-out wiring part on the undercoat layer, adhesiveness of the fine metal wires of the detection unit and the lead-out wiring part with the substrate is further improved.

A method of forming the undercoat layer is not particularly limited, and examples thereof include a method of applying a composition for forming an undercoat layer including a polymer to the flexible substrate and optionally performing a heat treatment thereon. Optionally, the composition for forming an undercoat layer may include a solvent. The kind of the solvent is not particularly limited. For example, a well-known solvent is used. In addition, as the composition for forming an undercoat layer including a polymer, a latex including polymer fine particles may be used.

The thickness of the undercoat layer is not particularly limited and, from the viewpoint of further improving adhesiveness of the fine metal wires of the detection unit and the lead-out wiring part with the substrate, is preferably 0.02 to 0.3 μm and more preferably 0.03 to 0.2 μm.

<Detection Unit and Lead-Out Wiring Part>

The line width of the fine metal wires forming the detection unit is not particularly limited and, from the viewpoint of a balance between conduction characteristics of the fine metal wires and inconspicuousness, the upper limit is preferably 30 μm or less, more preferably 15 μm or less, still more preferably 10 μm or less, still more preferably 5 μm or less, and still more preferably 3 μm or less. The lower limit of the line width is 0.5 μm or more and more preferably 1.0 μm or more. The line width of the fine metal wires forming the lead-out wiring part is not particularly limited, and the upper limit is preferably 500 μm or less, more preferably 50 μm or less, still more preferably 30 μm or less, and still more preferably 10 μm or less. In a case where the line width is in the above-described range, an electrode having a low resistance can be relatively easily formed.

The thickness of the fine metal wires is not particularly limited and, from the viewpoint of a balance between reduction in thickness and conduction characteristics, is preferably 0.01 mm to 30 mm, more preferably 10 μm or less, still more preferably 5 μm or less, still more preferably 0.01 to 3 μm, and most preferably 0.05 to 2 μm.

Examples of a material of the fine metal wires include a metal such as gold (Au), silver (Ag), molybdenum (Mo), copper (Cu), titanium (Ti), aluminum (Al), or tungsten (W) and an alloy thereof. Among these, silver or copper is preferable from the viewpoint of excellent conductivity of the fine metal wires.

From the viewpoint of adhesiveness between the fine metal wires and the flexible substrate, it is preferable that the fine metal wires include a binder.

As the binder, a resin is preferable from the viewpoint of further improving adhesiveness between the fine metal wires and the flexible substrate. For example, more specifically, at least one resin selected from the group consisting of a (meth)acrylic resin), a styrene resin, a vinyl resin, a polyolefin resin, a polyester resin, a polyurethane resin, a polyamide resin, a polycarbonate resin, a polydiene resin, an epoxy resin, a silicone resin, a cellulose polymer, and a chitosan polymer or a copolymer that is formed of monomers forming the resins can be used.

A method of manufacturing the fine metal wires is not particularly limited, and a well-known method can be adopted. For example, a method of exposing and developing a photoresist film on a metal foil formed on a flexible substrate surface to form a resist pattern and etching the exposed metal foil through the resist pattern can be used. In addition, for example, a method of printing a paste containing metal fine particles or metal nanowires on opposite main surfaces of the flexible substrate and plating the paste with metal can be used. In addition, for example, a method of patterning the flexible substrate surface to form a groove structure in advance and embedding a paste including metal fine particles or metal nanowires in the groove by screen printing can be used. In addition, for example, a method of printing a pattern of ink including metal fine particles or metal nanowires on the flexible substrate surface using an ink jet method to form the fine metal wires can be used.

Further, in addition to the above-described methods, for example, a method of using silver halide can be used. More specifically, a method described in paragraphs "0056" to "0114" of JP2014-209332A can be used. The method of using silver halide will be described in detail.

In a preferable configuration of the detection unit, for example, the detection unit includes a mesh pattern formed of fine silver wires. It is preferable that the first detection electrodes are disposed on the front surface of the flexible substrate and the second detection electrodes are disposed on the rear surface of the flexible substrate.

[Other Examples of Fine Metal Wires]

The first detection electrodes 30 and the second detection electrodes 32 in the detection unit 20 and the lead-out wirings 23 in the lead-out wiring part 22 are not limited to being formed of only metal and can be formed of conductive wires including a binder and a metal portion dispersed in the binder.

In the conductive wires, the binder includes a first polymer and a second polymer having a lower glass transition temperature than the first polymer. In the present specification, the glass transition temperature of the polymer refers to a glass transition temperature measured by differential scanning calorimetry (DSC). The glass transition temperature is measured "Testing Methods for Transition Temperatures of Plastics" defined by JIS K7121 (2012).

Examples of the first polymer and the second polymer include a hydrophobic polymer (hydrophobic resin), more specifically, at least one resin selected from the group consisting of an acrylic resin, a styrene resin, a vinyl resin, a polyolefin resin, a polyester resin, a polyurethane resin, a polyamide resin, a polycarbonate resin, a polydiene resin, an epoxy resin, a silicone resin, a cellulose polymer, and a chitosan polymer or a copolymer that is formed of monomers forming the resins.

In addition, it is preferable that the polymer has a reactive group that reacts with a crosslinking agent described below.

It is preferable that the polymer includes at least one unit selected from the group consisting of Formulae A, B, C, and D below.

In particular, as the first polymer, from the viewpoint of controlling the glass transition temperature to be lower, a polymer consisting of one unit selected from the group consisting of Formulae A, B, C, and D below is preferable, a polymer consisting of at least one unit selected from the group consisting of Formulae B, C, and D is more preferable, and a polymer consisting of a unit represented by Formula D is still more preferable.

A

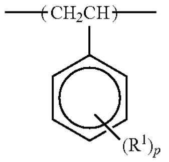

B

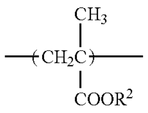

C

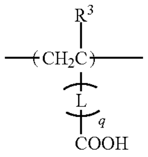

D

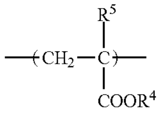

$R^1$ represents a methyl group or a halogen atom and preferably a methyl group, a chlorine atom, or a bromine atom, p represents an integer of 0 to 2, and it is preferably 0 or 1 and more preferably 0.

$R^2$ represents a methyl group or an ethyl group and preferably a methyl group.

$R^3$ represents a hydrogen atom or a methyl group and preferably a hydrogen atom. L represents a divalent linking group, and preferably a group represented by Formula (4).

$$—(CO—X^1)r\text{-}X^2— \qquad \text{Formula (4)}$$

In the formula. $X^1$ represents an oxygen atom or —$NR^{30}$—. Here, $R^{30}$ represents a hydrogen atom, an alkyl group, an aryl group, or an acyl group, each of which may have a substituent (for example, a halogen atom, a nitro group, or a hydroxyl group). $R^{30}$ represents preferably a hydrogen atom, an alkyl group having 1 to 10 carbon atoms (for example, a methyl group, an ethyl group, an n-butyl group, or an n-octyl group), or an acyl group (for example, an acetyl group or a benzoyl group). $X^1$ represents more preferably an oxygen atom or NH—.

$X^2$ represents an alkylene group, an arylene group, an alkylene arylene group, an arylene alkylene group, or an alkylene arylene alkylene group, and —O—, —S—, —OCO—, —CO—, —COO—, —NH—, —$SO_2$—, —$N(R^{31})$—, —$N(R^{31})SO_2$—, or the like may be inserted into this group in the middle. Here, $R^{31}$ represents a linear or branched alkyl group having 1 to 6 carbon atoms, and examples thereof include a methyl group, an ethyl group, and an isopropyl group. Preferable examples of $X^2$ include a dimethylene group, a trimethylene group, a tetramethylene group, an o-phenylene group, an m-phenylene group, a p-phenylene group, —$CH_2CH_2OCOCH_2CH_2$—, and —$CH_2CH_2OCO(C_6H_4)$—.

r represents 0 or 1.

q represents 0 or 1 and preferably 0.

$R^4$ represents an alkyl group having 1 to 80 carbon atoms, an alkenyl group, or an alkynyl group. As the first polymer, an alkyl group having 1 to 5 carbon atoms is preferable. As the second polymer, an alkyl group having 5 to 50 carbon atoms is preferable, an alkyl group having 5 to 30 carbon atoms is more preferable, and an alkyl group having 5 to 20 carbon atoms is still more preferable.

$R^5$ represents a hydrogen atom, a methyl group, an ethyl group, a halogen atom, or —$CH_2COOR^6$—, preferably a hydrogen atom, a methyl group, a halogen atom, or —$CH_2COOR^6$—, more preferably a hydrogen atom, a methyl group, or —$CH_2COOR^6$—, and still more preferably a hydrogen atom.

$R^6$ represents a hydrogen atom or an alkyl group having 1 to 80 carbon atoms and may be the same as or different from $R^4$. The number of carbon atoms in $R^6$ is preferably 1 to 70 and more preferably 1 to 60.

In another preferable configuration of the first and second polymers, from the viewpoint that permeation of moisture can be further prevented, for example, a polymer (copolymer) represented by Formula (5) can be used.

$$\text{-}(A)x\text{-}(B)y\text{-}(C)z\text{-}(D)w\text{-} \qquad \text{Formula (5)}$$

In Formula (4), each of A, B, C, and D represents the above-described repeating unit.

In Formula (5), x, y, z, and w represent a molar ratio of each repeating unit.

x represents 3 to 60 mol %, preferably 3 to 50 mol %, and more preferably 3 to 40 mol %.

y represents 30 to 96 mol %, preferably 35 to 95 mol %, and more preferably 40 to 90 mol %.

z represents 0.5 to 25 mol %, preferably 0.5 to 20 mol %, and more preferably 1 to 20 mol %.

w represents 0.5 to 40 mol % and preferably 0.5 to 30 mol %.

In Formula (5), it is still more preferable that x represents 3 to 40 mol %, y represents 40 to 90 mol %, z is 0.5 to 20 mol %, and w represents 0.5 to 10 mol %.

It is preferable that the polymer represented by Formula (5) is a polymer represented by Formula (6) or Formula (7).

Formula (6)

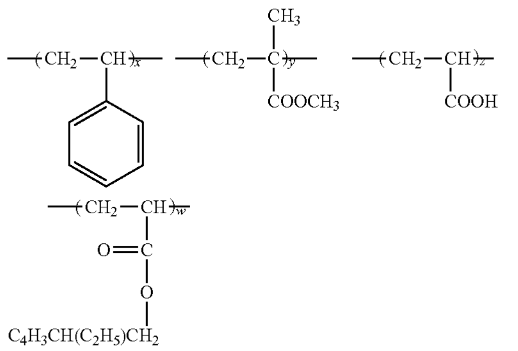

In Formula (6), x, y, z, and w are as defined above.

Formula (7)

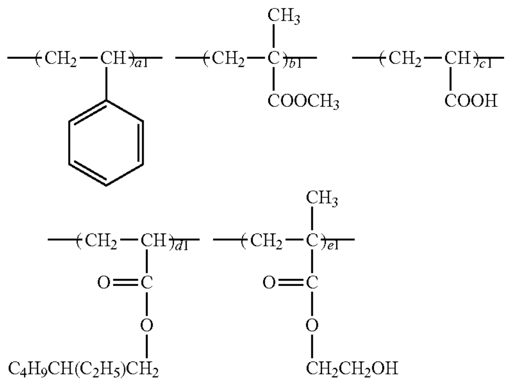

In Formula (7), a1, b1, c1, d1, and e1 represent molar ratios of the monomer units, a1 represents 3 to 60 (mol %), b1 represents 30 to 95 (mol %), c1 represents 0.5 to 25 (mol %), d1 represents 0.5 to 40 (mol %), and e1 represents 1 to 10 (mol %).

The preferable range of a1 is the same as the preferable range of the x described above, the preferable range of b1 is the same as the preferable range of the y described above, the preferable range of c1 is the same as the preferable range of the z described above, and the preferable range of d1 is the same as the preferable range of the w described above.

e1 represents 1 to 10 mol %, preferably 2 to 9 mol %, and more preferably 2 to 8 mol %.

The weight-average molecular weight of the polymer represented by Formula (5) is preferably 1000 to 1,000,000, more preferably 2000 to 750.000, and still more preferably 30 W to 500,000.

The polymer represented by Formula (5) can be synthesized with reference to, for example, JP3305459B and JP3754745B.

The glass transition temperatures of the first polymer and the second polymer are not particularly limited. The glass transition temperature of the first polymer is preferably 0° C. or higher, more preferably 25° C. or higher, and still more preferably higher than 40° C. The upper limit is not particularly limited and, in general, is preferably 120° C. or lower.

In addition, the glass transition temperature of and the second polymer is not particularly limited and is preferably 40° C. or lower, more preferably 25° C. or lower, still more preferably lower than 25° C., still more preferably 0° C. or lower, and most preferably lower than 0° C. The lower limit is not particularly limited and, in general, is preferably −50° C. or higher.

A difference (absolute value) between the glass transition temperature of the first polymer and the glass transition temperature of the second polymer is not particularly limited and, in general, is preferably 20° C. to 100° C.

The metal portion in the conductive wire is a portion that ensures conduction characteristics and is formed of a metal. As the metal forming the metal portion, from the viewpoint of further improving conduction characteristics, one metal selected from the group consisting of gold (metallic gold), silver (metallic silver), copper (metallic copper), nickel (metallic nickel), and palladium (metallic palladium) is preferable.

Figure 10:
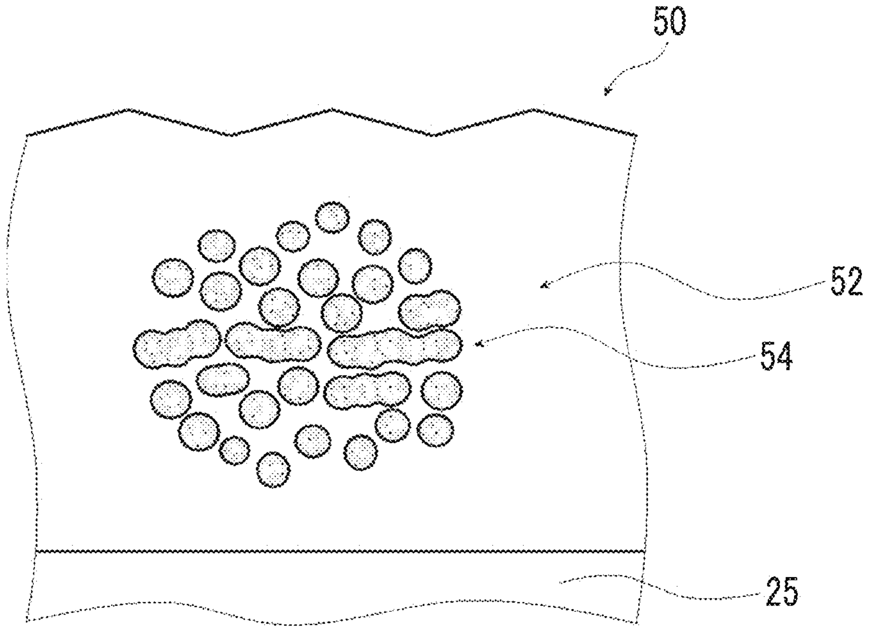
FIG. 10 is an enlarged schematic diagram showing an example of a fine metal wire of the detection unit according to the embodiment of the present invention.

FIG. 10 is an enlarged view showing a conductive wire 50. FIG. 10 shows a configuration in which a metal portion 54 is dispersed in the conductive wire 50 in a particle shape. The configuration of the metal portion 54 is not limited to a particle shape, and a configuration in which the metal portion 54 is dispersed in the conductive wire 50 in a layered shape (not shown) may be adopted.

The conductive wire 50 shown in FIG. 10 includes: a binder 52 that includes a first polymer and a second polymer; and a plurality of metal portions 54 that are dispersed in the binder 52. The metal portion 54 has a particle shape as described above.

The conductive wire may include a material other than the above-described materials. Examples of the material other than the above-described materials include non-metallic fine particles. Examples of the non-metallic fine particles include resin particles and metal oxide particles. Among these, metal oxide particles are preferable.

Examples of the metal oxide particles include silicon oxide particles and titanium oxide particles.

The average particle diameter of the non-metallic fine particles is not particularly limited and, in terms of sphere equivalent diameter, is preferably 1 to 1000 nm, more preferably 10 to 500 nm, and still more preferably 20 to 200 nm. In the above-described range, the detection unit is likely to have higher transparency and higher conductivity.

The sphere equivalent diameter of the non-metallic fine particles is obtained by calculating sphere equivalent diameters of any 50 particles using a transmission electron microscope and obtaining an arithmetic mean value thereof.

<Metal Stabilizer>

In addition, in order to stabilize the metal portion, it is preferable that the conductive wire includes a metal stabilizer on or in the metal portion or in the binder. As the metal stabilizer, the following materials can be used alone or in combination of two or more kinds.

Corrosion inhibitors described in paragraphs "0075" to "0086" of JP2009-505358A

Metal ion trappers described in paragraphs "0077" to "0092" of JP2009-188360A

Nitrogen-containing heterocyclic compounds having a mercapto group described in paragraphs "0044" to "0047" of JP2012-146548A Compositions for forming a silver ion diffusion suppressing layer described in paragraphs "0018" to "0049" of JP2013-224397A Compounds for forming a silver ion diffusion suppressing layer described in paragraphs "0030" to "0066" of JP2014-075115A Rust inhibitors described in paragraphs "0050" to "0057" of JP2018-024784A Mercaptobenzothiazoles described in paragraphs "0050" to "0057" of JP2019-016488A In addition, as the metal stabilizer, specific compounds described below can be preferably used.

As the metal stabilizer, the following compounds or salts thereof are preferable.

2-mercaptobenzothiazole, 2-mercaptobenzimidazole, 5-mercapto-1-phenyl-1H-tetrazole, 1-(4-carboxyphenyl)-5-mercapto-1H-tetrazole, 3-mercapto-1,2,4-triazole, sodium 1-(m-sulfophenyl)-5-mercapto-1H-tetrazole, 2-mercapto-benzoxazole, 1,2,3-benzotriazole, 1-(3-acetanidephenyl)-5-mercaptotetrazole, 5-amino-2-mercaptobenzimidazole, 6-amino-2-mercaptobenzothiazole, thiocyanuric acid, 6-(dibutylamino)-1,3,5-triazine-2,4-dithiol, 2-mercaptothi-azoline, diethylammonium diethyldithiocarbamate, (2-benzothiazolylthio)acetic acid, 3-(2-benzothiazolylthio)propionic acid, 6-(dibutylamino)-1,3,5-triazine-2,4-dithiol, 2-amino-5-mercapto-1,3,4-thiadiazole, 2-mercapto-5-methylthio-1,3,4-thiadiazole, 2-mercapto-5-ethylthio-1,3,4-thiadiazole, 2-5-dimercapto-1,3,4-thiadiazole, 2-thioacetic acid-5-mercapto-1,3,4-thiadiazole, 2-aminopyrimidine, 5,6-dimethylbenzimidazole, and 2-mercaptopyrimidine.

In particular, as the metal stabilizer, a compound selected from compounds having a mercaptothiazole skeleton or a mercaptothiadiazole skeleton or salts thereof is particularly effective for improving sulfurization resistance and is most preferable. Specific examples of the most preferable compound include 2-mercaptobenzothiazole, 5-methyl-2-mercaptobenzothiazole, 2-amino-5-mercapto-1,3,4-thiadiazole, 2-mercapto-5-methylthio-1,3,4-thiadiazole, 2-mercapto-5-ethylthio-1,3,4-thiadiazole, 2-5-dimercapto-1,3,4-thiadiazole, and derivatives or salts thereof.

The introduction of the metal stabilizer is effective for improving the durability of the metallic material in the bending portion and the non-bending portion and, particularly in a case where silver is used in the metal portion, is effective for suppressing migration and sulfurization, which is preferable. As a method of introducing the metal stabilizer, a method of bringing a conductive film into contact with a solution including a metal stabilizer by application or dipping during or after the formation of the conductive wire, or a method of depositing a metal stabilizer on a conductive film in a gas phase reaction by fumigation or the like can be preferably used. In addition, it is also preferable that the transparent insulation layer includes the metal stabilizer. In particular, in a case where the transparent insulation layer includes the metal stabilizer in advance, contact between the solvent and the conductive wire that is required to dissolve the metal stabilizer is necessary, and damage of the conductive wire or the binder by the solvent can be avoided, which is preferable. Therefore, it is preferable that at least one of the first transparent insulation layer or the second transparent insulation layer includes the metal stabilizer.

The amount of the metal stabilizer used is not particularly limited, and the amount thereof per conductive layer in at least one of the transparent insulation layer or the conductive film is preferably 1 $mg/m^2$ to 10 $g/m^2$ and more preferably 10 $mg/m^2$ to 1 $g/m^2$.

The shape of the conductive wire is not particularly limited and is preferably a linear shape (for example, a straight line, a curve, or a combination thereof) such that the detection performance of a touch position can be obtained in a case where the conductive wire is applied to a touch panel. In this case, the line width of the conductive wire is not particularly limited and, from the viewpoint of a balance between conduction characteristics of the conductive wire and inconspicuousness, is preferably 30 μm or less, more preferably 15 μm or less, still more preferably 10 μm or less, still more preferably 5 μm or less, and still more preferably 3 μm or less. The lower limit of the line width is 0.5 μm or more and more preferably 1.0 μm or more.

The thickness of the conductive wire is not particularly limited and, from the viewpoint of a balance between reduction in thickness and conduction characteristics, is preferably 0.01 mm to 30 mm, more preferably 10 μm or less, still more preferably 5 μm or less, still more preferably 0.01 to 3 μm, and most preferably 0.05 to 2 μm.

In this case, the preferable line width and thickness of the conductive wire refer to the width and thickness of a region where the metal is present.

<Method of Manufacturing Detection Unit>

A method of manufacturing the detection unit will be described using a case where the metal portion of the fine metal wire includes silver (metallic silver) as an example. From the viewpoint of obtaining higher productivity, a method including the following steps is preferable.

Step A:

A step of forming a silver halide photosensitive layer on the flexible substrate by simultaneously applying a silver halide-containing coating liquid including at least silver halide and the first polymer and a composition adjusting coating liquid including at least the second polymer Step B:

A step of forming a conductive wire including metallic silver by exposing the silver halide photosensitive layer and developing the exposed silver halide photosensitive layer Hereinafter, each of the steps will be described in detail.

<Step A>

The step A is a step of forming a silver halide photosensitive layer on the flexible substrate by simultaneously applying a silver halide-containing coating liquid including at least silver halide and the first polymer and a composition adjusting coating liquid including at least the second polymer.

The lamination order of the coating liquids during the simultaneous multilayer application is not particularly limited. The silver halide-containing coating liquid and the composition adjusting coating liquid may be laminated in this order from the flexible substrate side. Conversely, the composition adjusting coating liquid and the silver halide-containing coating liquid may be laminated in this order from the flexible substrate side. Further, the composition adjusting coating liquid, the silver halide-containing coating liquid, and the composition adjusting coating liquid may be laminated in this order.

"Application to the flexible substrate" includes not only a case where a coating liquid is directly applied to the flexible substrate surface but also a case where another layer is disposed on the flexible substrate and a coating liquid is applied to this layer.

In this step, the silver halide-containing coating liquid including silver halide and the composition adjusting coating liquid not including silver halide are simultaneously applied. Therefore, diffusion of components progresses at an interface between the coating films of the two layers formed of the coating liquids. More specifically, diffusion of a part of silver halide and the first polymer from the coating film (hereinafter, also referred to as "coating film A") that is formed of the silver halide-containing coating liquid disposed on the flexible substrate to the coating film (hereinafter, also referred to as "coating film B") that is formed of the composition adjusting coating liquid progresses. As a result, a region of the coating film B on the coating film A side includes silver halide and the first polymer, in which the content thereof is less than the content of silver halide and the first polymer in the coating film A.

A region (hereinafter, also referred to as "region w") of the coating film B on the coating film A side includes the silver halide moved from the coating film A. Therefore, afler performing the step B described below, this region w forms an upper region in the conductive wire. In this case, in the region w of the conductive wire, a content mass ratio of the content of the second polymer to the sum of the content of the first polymer and the content of the second polymer is likely to be more than that in an intermediate region.

In a case where the silver halide-containing coating liquid includes at least silver halide and the first polymer, the silver halide-containing coating liquid may further include the second polymer. In this case, a content mass ratio of the content of the second polymer to the sum of the content of the first polymer and the content of the second polymer in the silver halide-containing coating liquid is preferably less than a content mass ratio of the content of the second polymer to the sum of the content of the first polymer and the content of the second polymer in the composition adjusting coating liquid.

In addition, the composition adjusting coating liquid may include at least the second polymer and may further include silver halide and/or the first polymer. In a case where the composition adjusting coating liquid further includes silver halide, the content of the silver halide is not particularly limited, and the content of silver halide in the silver halide-containing coating liquid is preferably less than the content of silver halide in the composition adjusting coating liquid. As a result, a detection unit where external light reflection is suppressed is likely to be obtained.

In a case where the composition adjusting coating liquid further includes the first polymer, a content mass ratio of the content of the first polymer to the sum of the content of the first polymer and the content of the second polymer in the composition adjusting coating liquid is preferably less than a content mass ratio of the content of the first polymer to the sum of the content of the first polymer and the content of the second polymer in the silver halide-containing coating liquid.

The silver halide in the silver halide-containing coating liquid is not particularly limited, and a well-known silver halide can be used. The halogen element in the silver halide may be any one of chlorine, bromine, iodine, or fluorine and may be a combination thereof. For example, a silver halide mainly formed of silver chloride, silver bromide, or silver iodide is preferably used, and a silver halide mainly formed of silver chloride or silver bromide is more preferably used. Silver chlorobromide, silver iodochlorobromide, or silver iodobromide is also preferably used. Silver chlorobromide, silver bromide, silver iodochlorobromide, or silver iodobromide is more preferably used, and silver chlorobromide including 50 mol % of more of silver chloride or silver iodochlorobromide is most preferably used.

Here, for example, the "silver halide mainly formed of silver bromide" refers to a silver halide in which the molar fraction of bromide ions in the silver halide composition is 50% or more. The silver halide particles mainly formed of silver bromide may include iodide ions and chloride ions in addition to the bromide ions.

The silver halide has a solid particle shape, and the average particle size of the silver halide is, in terms of sphere equivalent diameter, preferably 0.1 to 1000 nm (1 μm), more preferably 0.1 to 300 nm, and still more preferably 1 to 200 nm.

The sphere equivalent diameter of a silver halide particle refers to the diameter of a particle having the same volume of which the shape is spherical.

The shape of the silver halide particles is not particularly limited, and various shapes such as a spherical shape, a cubic shape, a flat plate shape (a hexagonal flat plate shape, a triangular flat plate shape, a quadrangular flat plate shape, or the like), an octahedron shape, or a tetradecahedron shape can be used.

In addition, the use of metal compounds belonging to Group VIII and Group VIIB such as a rhodium compound or an iridium compound and a palladium compound used for stabilization or high sensitivity of the silver halide can refer to the description of paragraphs "0039" to "0042" of JP2009-188360A. Further, chemosensitization can refer to the description of the technique of paragraph "0043" of JP2009-188360A.

The configurations of the first polymer that is included in the silver halide-containing coating liquid and may be included in the composition adjusting coating liquid and the second polymer that is included in the composition adjusting coating liquid and may be included in the silver halide-containing coating liquid are as described above, and thus the description thereof will not be repeated.

The silver halide-containing coating liquid and the composition adjusting coating liquid may include components other than the silver halide, the first polymer, and the second polymer, and these components are common to the silver halide-containing coating liquid and the composition adjusting coating liquid and are as described below.

The silver halide-containing coating liquid and the composition adjusting coating liquid may further include gelatin.

The kind of gelatin is not particularly limited. For example, not only lime-treated gelatin but also acid-treated gelatin may be used, and a hydrolyzate of gelatin, an enzymatic decomposition product of gelatin, or gelatin with a modified amino group and/or a modified carboxyl group (phthalated gelatin or acetylated gelatin) can also be used.

The silver halide-containing coating liquid and the composition adjusting coating liquid may further include a solvent. Examples of the solvent to be used include water, organic solvents (for example alcohols such as methanol, ketones such as acetone, amides such as formamide, sulfoxides such as dimethyl sulfoxide, esters such as ethyl acetate, or ethers), an ionic liquid, and a mixed solvent thereof.

The silver halide-containing coating liquid and the composition adjusting coating liquid may optionally include materials other than the above-described materials. For example, it is preferable that the silver halide-containing coating liquid and the composition adjusting coating liquid include a crosslinking agent used for crosslinking agent the first polymer and the second polymer. By including the crosslinking agent, crosslinking between the polymers progresses, and even in a case where the gelatin is decomposed and removed in a step described below, linking between the metallic silver particles is maintained. As a result, conduction characteristics are further improved.

A method of simultaneously applying the silver halide-containing coating liquid and the composition adjusting coating liquid is not particularly limited, and a well-known method can be adopted. For example, a die coating method is preferably used. Examples of the die coating method include a slide coating method, an extrusion coating method, and a curtain coating method. Among these, a slide coating method or extrusion coating is preferable, and extrusion coating having high suitability for thin layer coating is most preferable.

During the simultaneous multilayer application, from the viewpoint of easily obtaining the configuration of the first embodiment of the conductive film for a touch panel, it is preferable to use the composition adjusting coating liquid that includes the second polymer having a composition where the dry thickness of a film (surface film) formed during application to a predetermined substrate is 300 nm or more.

In addition, after performing the simultaneous multilayer application, the obtained coating film may be optionally dried. By performing the drying process, the solvent in the coating film obtained by the silver halide-containing coating liquid and the coating film obtained by the composition adjusting coating liquid can be easily removed.

Through the above-described process, the photosensitive layer including silver halide can be formed on the flexible substrate. In the present specification, "the photosensitive layer including silver halide" will also be referred to as "silver halide photosensitive layer" or simply "photosensitive layer".

<Step B>

The step B is a step of forming a fine metal wire including metallic silver by exposing the silver halide photosensitive layer and developing the exposed silver halide photosensitive layer.

Through this step, the silver halide is reduced to form the conductive wire including metallic silver. Typically, the exposure treatment is performed in a patterned manner, and the conductive wire including metallic silver is formed in the exposed portion. On the other hand, in the non-exposed portion, silver halide is eluted by the development treatment described below. A non-conductive wire including the gelatin and the polymer is formed. The non-conductive wire does not substantially include metallic silver, and the non-conductive wire refers to a region that does not exhibit conductivity.

Hereinafter, the exposure treatment and the development treatment performed in this step will be described below.

The exposure treatment is a treatment of exposing the photosensitive layer. By exposing the photosensitive layer in a patterned manner, the silver halide in the photosensitive layer in the exposed region forms a latent image. In the region where the latent image is formed, the conductive wire is formed through the development treatment described below. On the other hand, in the non-exposed region that is not exposed, during the development treatment described below, the silver halide is dissolved and is eluted from the photosensitive layer, and a transparent film (non-conductive wire) is obtained.

A light source used for the exposure is not particularly limited, and examples thereof include light such as visible light or ultraviolet light and a radiation such as an X-ray.

A method of performing pattern exposure is not particularly limited. For example, the pattern exposure may be performed by surface exposure using a photomask or may be performed by scanning exposure using a laser beam. A shape of the pattern is not particularly limited and is appropriately adjusted according to the pattern of the conductive wire to be formed.

A method of the development treatment is not particularly limited. For example, a technique of a typical development treatment used for a silver halide photographic film, photographic printing paper, a printing plate making film, or an emulsion mask for a photomask can be used.

The kind of a developer used for the development treatment is not particularly limited. For example, a phenidone hydroquinone (PQ) developer, a metol hydroquinone (MQ) developer, or a metol ascorbic acid (MAA) developer can also be used.

The development treatment can include a fixing treatment that is performed in order to remove the silver halide in the non-exposed portion for stabilization. In the fixing treatment, a technique of a fixing treatment used for a silver halide photographic film, photographic printing paper, a printing plate making film, or an emulsion mask for a photomask can be used.

The fixing temperature in the fixing step is preferably about 20° C. to about 50° C. and more preferably 25° C. to 45° C. In addition, the fixing time is preferably 5 seconds to 1 minute and more preferably 7 seconds to 50 seconds.

It is preferable the photosensitive layer that undergoes the development and fixing treatment undergoes a water cleaning treatment and a stabilization treatment.

Steps other than the step A and the step B may be provided.

Examples of the Other Steps Include:

a step F of fusing the metallic silvers of the conductive wires after the step B;

a step C1 of bringing the silver halide photosensitive layer and a compound having a metal-adsorbing substituent or a metal-adsorbing structure (hereinafter, also referred to as "specific compound") into contact with each other before the step B and after the step A;

a step C2 of bringing the conductive wire and the specific compound into contact with each other before the step F and after the step B;

a step D of further consolidating the conductive wire before the step F and after the step B; and a step E of removing gelatin in the conductive wire before the step D and after the step B in a case where at least one selected from the group consisting of the silver halide-containing coating liquid and the composition adjusting coating liquid includes the gelatin.

Examples of the other steps include an easy adhesion layer forming step described below.

Hereinafter, the other steps will be described.

(Step F)

The step F is a step of fusing the metallic silvers of the conductive wires (included in the conductive wires) after the step B. In this step, as a result of fusing the metallic silvers, a detection unit including fine metal wires having higher conductivity can be obtained.

A heating method is not particularly limited, and examples thereof include a process of bringing the flexible substrate including the conductive wire into contact with superheated vapor.

The superheated vapor may be superheated steam or may be a mixture obtained by mixing superheated steam with another gas.

It is preferable that the superheated steam comes into contact with the conductive wire in a supply time range of 10 to 300 seconds. In a case where the supply time is 10 seconds or longer, the improvement of the conductivity is large. In addition, in a case where the supply time is 300 seconds or less, the conductivity is sufficiently improved, which is more preferable from the viewpoint of economical efficiency.

In addition, it is preferable that the superheated steam comes into contact with the conductive wire in a supply time range of 500 to 600 g/m$^3$, and the temperature of the superheated vapor is controlled to be preferably 100° C. to 160° C.

Another method of the heating treatment is, for example, a heating treatment at 80° C. to 150° C.

The heating time is not particularly limited and, from the viewpoint of further improving the above-described effect, is preferably 0.1 to 5.0 hours and more preferably 0.5 to 1.0 hours.

(Step C1)

The step C1 is a step of bringing the silver halide photosensitive layer and the specific compound into contact with each other before the step B and after the step A. In this step, the fusion between the metallic silvers formed in the subsequent step B is suppressed. In this step, the specific compound is brought into contact with the silver halide photosensitive layer. Therefore, in a region (interfacial region) of the silver halide photosensitive layer closer to the surface, the effect of suppressing the fusion between the metallic silvers is obtained. Accordingly, particularly in the conductive wire obtained in the subsequent step, the fusion between the metallic silvers in the interfacial region is likely to be further inhibited. In addition, even in this case, it is presumed that the metallic silvers are sufficiently fused in an intermediate region of the conductive wire, and the detection unit having excellent conductivity can be obtained.

The method of manufacturing the detection unit preferably includes the step C1 or the step C2 and may include the step C1 and the step C2.

A method of bringing the specific compound into contact with the silver halide photosensitive layer is not particularly limited, and examples thereof include Typically, a method of bringing a solution where the specific compound is dissolved and/or dispersed into contact with the silver halide photosensitive layer can be used. In addition, a method of bringing a gas including the specific compound into contact with the silver halide photosensitive layer may also be used.

The method of bringing the solution including the specific compound into contact with the silver halide photosensitive layer is not particularly limited, and examples thereof include a method dipping the silver halide photosensitive layer in the solution and a method of applying the solution to the silver halide photosensitive layer. Among these, the method of dipping the silver halide photosensitive layer in the solution is more preferable. The method of dipping the silver halide photosensitive layer in the solution is preferable because the method can be more stably performed with a simpler device and the residual solution can be easily removed by cleaning after dipping.

In addition, a method of bringing the silver halide photosensitive layer into contact with a gas and/or a solution including a compound having a metal-adsorbing site also has a characteristics in that the metallic silver is likely to be adsorbed on the above-described compound on the surface of the silver halide photosensitive layer. As a result, the fusion between the metallic silvers on the surface of the conductive wire is likely to be further inhibited.

The specific compound is a compound having a metal-adsorbing substituent or a metal-adsorbing structure (hereinafter, collectively referred to as "metal-adsorbing site").

The metal-adsorbing substituent is not particularly limited. The metal-adsorbing substituent is preferably at least selected from the group consisting of a carboxyl group or a salt thereof, an acid amide group, an amino group, an imidazole group, a pyrazole group, a thiol group, a thioether group, and a disulfide group.

The metal-adsorbing structure is not particularly limited, and a nitrogen-containing heterocycle is preferable, a 5- or 6-membered ring azole is preferable, and a 5-membered ring azole is more preferable.

Examples of the nitrogen-containing heterocycle include a tetrazole ring, a triazole ring, an imidazole ring, a thiadiazole ring, an oxadiazole ring, a selenadiazole ring, an oxazole ring, a thiazole ring, a benzoxazole ring, a benzothiazole ring, a benzimidazole ring, a pyrimidine ring, a triazaindene ring, a tetraazaindene ring, a benzoindazole ring, a benzotriazole ring, a benzoxazole ring, a benzothiazole ring, a pyridine ring, a quinoline ring, a piperidine ring, a piperazine ring, a quinoxaline ring, a morpholine ring, and a pentaazaindene ring.

These rings have a substituent, and Examples of the substituent include a nitro group, a halogen atom (for example, a chlorine atom or a bromine atom), a cyano group, a substituted or unsubstituted alkyl group (for example, each of a methyl group, an ethyl group, a propyl group, a t-butyl group, and a cyanoethyl group), an aryl group (for example, each group of a phenyl group, a 4-methanesulfonamide phenyl group, a 4-methylphenyl group, a 3,4-dichlorophenyl group, and a naphthyl group), an alkenyl group (for example, an allyl group), an aralkyl group (for example, each of a benzyl group, a 4-methylbenzyl group, and a phenethyl group), a sulfonyl group (for example, each of a methanesulfonyl group, an ethanesulfonyl group, and a p-toluenesulfonyl group), a carbamoyl group (for example, each of an unsubstituted carbamoyl group, a methylcarbamoyl group, and a phenylcarbamoyl group), a sulfamoyl group (for example, each of an unsubstituted sulfamoyl group, a methylsulfamoyl group, and a phenylsulfamoyl group), a carbonamide group (for example, each of an acetamide group and a benzamide group), a sulfonamide group (for example, each of a methanesulfonamide group, a benzenesulfonamide group, and a p-toluene sulfonamide group), an acyloxy group (for example, each an acetyloxy group, and a benzoyloxy group), a sulfonyloxy group (for example, a methanesulfonyloxy group), a ureido group (for example, each of an unsubstituted ureido group, a methylureido group, an ethylureido group, and a phenylureido group), an acyl group (for example, each of an acetyl group and a benzoyl group), an oxycarbonyl group (for example, each of a methoxycarbonyl group, and a phenoxycarbonyl group), and a hydroxyl group. One ring may have a plurality of substituents.

As the above-described compound, a compound having a nitrogen-containing 6-membered ring (nitrogen-containing 6-membered ring compound) is preferable, and as the nitrogen-containing 6-membered ring compound, a compound having a triazine ring, a pyrimidine ring, a pyridine ring, a pyrroline ring, a piperidine ring, a pyridazine ring, or a pyrazine ring is preferable, and a compound having a triazine ring or a pyrimidine ring is more preferable. The nitrogen-containing 6-membered ring compound may have a substituent, and Examples of the substituent include an alkyl group having 1 to 6 carbon atoms (having preferably 1 to 3 carbon atoms), an alkoxy group (having 1 to 6 carbon atoms (preferably having 1 to 3 carbon atoms), a hydroxyl group, a carboxyl group, a mercapto group, an alkoxyalkyl group (having 1 to 6 carbon atoms (preferably having 1 to 3 carbon atoms), and a hydroxyalkyl group having 1 to 6 carbon atoms (preferably having 1 to 3 carbon atoms).

Specific examples of the nitrogen-containing 6-membered ring compound include triazine, methyltriazine, dimethyltriazine, hydroxyethyltriazine, pyrimidine, 4-methylpyrimidine, pyridine, and pyrroline.

The above-described compound may have one metal-adsorbing site alone or a combination of two or more metal-adsorbing sites. It is preferable that the above-described compound two or more metal-adsorbing sites.

(Step C2)

The step C2 is a step of bringing the conductive wire and the specific compound into contact with each other before the step F and after the step B. In this step, the fusion between the metallic silvers of the conductive wire (included in the conductive wire) is suppressed. In this step, the specific compound is brought into contact with the conductive wire. Therefore, in a region (interfacial region) of the conductive wire closer to the surface, the effect of suppressing the fusion between the metallic silvers is obtained. Accordingly, in the interfacial region of the conductive wire, the fusion between the metallic silvers is likely to be further inhibited. In addition, even in this case, it is presumed that the metallic silvers are sufficiently fused in an intermediate region of the conductive wire, and the detection unit having excellent conductivity can be obtained.

In this step, a method of bringing the conductive wire and the specific compound into contact with each other, a configuration of the specific compound, and the like are the same as the configurations in the step C1 described above, and thus the description thereof will not be repeated.

(Step D)

The step D is a step of further consolidating the conductive wire before the step F and after the step B. Through this step, the conductivity of the conductive wire is likely to be further improved, and the adhesiveness of the conductive wire with the flexible substrate is likely to be further improved.

A method of consolidating the conductive wire is not particularly limited. For example, a calendering treatment step of causing the flexible substrate including the conductive wire to pass through at least a part of rolls under pressure is preferable. Hereinafter, the consolidation treatment using a calendering roll will also be referred to as "calendering treatment".

Examples of the roll used for the calendering treatment include a plastic roll and a metal roll. From the viewpoint of preventing wrinkles, a plastic roll is preferable. The pressure between the rolls is not particularly limited. The pressure between rolls can be measured using PRESCALE (for high pressure) manufactured by FUJIFILM Corporation.

From the viewpoint of making the obtained conductive wire inconspicuous, the surface roughness Ra of the roll used for the calendering treatment is preferably 0 to 2.0 μm and more preferably 0.3 to 1.0 μm.

The temperature of the consolidation treatment is not particularly limited and is preferably 10° C. (no temperature control) to 100° C. and, although the temperature varies depending on the scanning density, shape, and binder kind of the pattern of the conductive wire, more preferably 10° C. (no temperature control) to 50° C.

(Step E)

The step E is a step of removing gelatin of the conductive wire (included in the conductive wire) before the step D and after the step B in a case where at least one selected from the group consisting of the silver halide-containing coating liquid and the composition adjusting coating liquid includes the gelatin. By removing the gelatin, the content of the metallic silver in the conductive wire relatively increases. Therefore, the conductive wire having higher conductivity can be obtained.

The step E may be a step of removing the entirety of gelatin or may be a step of removing a part of gelatin. In addition, in the step E, gelatin may be removed not only from the conductive wire but also from a portion (for example, non-conductive wire) of the flexible substrate other than the conductive wire.

A method of removing gelatin is not particularly limited, and examples thereof include a method of decomposing and removing gelatin using a proteolytic enzyme and a method of decomposing and removing gelatin using a predetermined oxidant.

As the method of decomposing and removing gelatin using a proteolytic enzyme, for example, a method described in paragraphs "0084" to "0077" of JP2014-209332A can be adopted.

In addition, as the method of decomposing and removing gelatin using an oxidant, for example, a method described in paragraphs "0064" to "0066" of JP2014-112512A can be adopted.

(Undercoat Layer Forming Step)

The undercoat layer forming step is a step of obtaining a flexible substrate with an undercoat layer by forming an undercoat layer on the flexible substrate before the step A. A method of forming the undercoat layer on the flexible substrate is not particularly limited, and examples thereof include a method of applying the composition for forming an undercoat layer to the flexible substrate. In the undercoat layer forming step, it is preferable that the undercoat layer to be formed is adjusted such that an absolute value of a difference in refractive index from another adjacent layer (for example, the flexible substrate or the non-conductive wire) is further reduced. A method of adjusting the difference in refractive index between the undercoat layer and the other adjacent layer is not particularly limited, and examples thereof include a method of adjusting the kind of each of the components in the composition used for forming each of the layers.

A method of forming the undercoat layer is not particularly limited, and examples thereof include a method of applying a composition for forming an undercoat layer to the flexible substrate and optionally heating the applied composition for forming an undercoat layer. The composition for forming an undercoat layer does not need to include a solvent. The kind of the solvent is not particularly limited and is the same as those described above as the solvent that may be included in the silver halide-containing coating liquid.

The thickness of the undercoat layer is not particularly limited and, from the viewpoint of further improving adhesiveness between the flexible substrate and the silver halide photosensitive layer and the conductive wire, is preferably 0.02 to 0.3 μm.

The undercoat layer is not particularly limited. For example, preferable examples of an adhesive layer described in JP2008-208310A can be suitably used.

<Another Method of Manufacturing Detection Unit>

The method of the manufacturing the fine metal wires forming the detection unit and the lead-out wiring part is not particularly limited to the above-described method. For example, a plating method, a vapor deposition method, or printing method can be appropriately used.

The method of forming the fine metal wires using the plating method will be described. For example, the fine metal wires can be formed using a metal plating film that is formed on an electroless plating underlayer by performing electroless plating on the underlayer. In this case, the fine metal wires are formed by forming a catalyst ink including at least metal fine particles on a substrate in a patterned manner and dipping the substrate in an electroless plating bath to form a metal plating film. More specifically, a method of manufacturing a metal-coated substrate described in JP2014-159620A can be used. In addition, the fine metal wires are formed by forming a resin composition having at least a functional group capable of interacting a metal catalyst precursor on a substrate in a patterned manner, adding a catalyst or catalyst precursor, and dipping the substrate in an electroless plating bath to form a metal plating film. More specifically, a method of manufacturing a metal-coated substrate described in JP2012-144761A can be used.

The method of forming the fine metal wires using the vapor deposition method will be described. The fine metal wires can be formed by forming a copper foil layer by vapor deposition first and forming copper wires using the copper foil layer using a photolithography method. As the copper foil layer, an electrolytic copper foil can be used in addition to a vapor deposition copper foil. More specifically, a step of forming copper wires described in JP2014-29614A can be used.

The method of forming the fine metal wires using the vapor printing method will be described. First, by applying a conductive paste including conductive powder to a substrate in the same pattern as the fine metal wires and subsequently heating the conductive paste, the fine metal wires can be formed. The pattern formation using the conductive paste is performed, for example, using an ink jet method or a screen printing method. As the conductive paste, more specifically, a conductive paste described in JP2011-28985A can be used.

<Transparent Insulation Layer>

The transparent insulation layer is disposed between the image display module, the conductive film, the polarizing plate, the cover portion, and the like of the touch panel. As the transparent insulation layer, for example, an optically clear adhesive (OCA) or an optically clear resin (OCR) such as an ultraviolet (UV)-curable resin can be used. However, the transparent insulation layer is not limited to these examples.

On the front surface and the rear surface of the flexible substrate, the transparent insulation layer may be disposed to cover a region where the detection unit and the lead-out wiring part are not provided and the detection unit and the lead-out wiring part. In this case, the transparent insulation layer is transparent, has electric insulating characteristics, and further has a function of protecting the detection unit and the lead-out wiring part.

The thickness of the transparent insulation layer is not particularly limited and, from the viewpoint of further improving adhesiveness and further improving step followability, is preferably 10 to 200 μm and more preferably 20 to 100 μm.

The transparent insulation layer has light-transmitting properties as described above.

The total light transmittance of the conductive film including the transparent insulation layer with respect to a visible range (wavelength of 400 to 700 nm) is preferably 85% or more and more preferably 90% or more.

The above-described total light transmittance is measured using a spectrophotometer CM-3600A (manufactured by Konica Minolta Inc.).

The total light transmittance of the transparent insulation layer itself is preferably adjusted such that the conductive film exhibits the above-described total light transmittance, and is preferably at least 85%.

Various well-known particle-shaped or foil-shaped additives in the related art, for example, a metal stabilizer, a leveling agent, a surface lubricant, an antioxidant, a corrosion inhibitor, a light stabilizer, an ultraviolet absorber, a polymerization inhibitor, a silane coupling agent, an inorganic or organic filler, or powder such as metal powder or a pigment can be appropriately added to a composition for forming a transparent insulation layer.

<Protective Layer>

The protective layer in the conductive film according to the embodiment of the present invention is provided using the photosensitive resin composition described below to cover at least a part of the fine metal wires formed on the surface of the transparent flexible substrate. As shown in FIG. 4 or 5, in order to suppress disconnection caused by sulfur or halogen in an external environment or iodine eluted from the polarizing plate, it is more preferable that the protective layer is provided to cover the entirety of the lead-out wiring part. In a case where the lead-out wirings are disposed on both surfaces of the conductive film, it is preferable that the protective layer is formed on both of the surfaces. The protective layer may be further cover a part of the detection electrode extending to the inactive area.

[Step of Forming Protective Layer]

A method of forming the protective layer using the photosensitive resin composition is not particularly limited. For example, a method (application method) of forming a cured film by determining a design thickness of the protective layer, applying the photosensitive resin composition to the substrate, and optionally curing the coating film or a method (transfer method) of forming the protective layer on a temporary substrate and transferring the protective laver to the substrate surface can be used. In particular, from the viewpoint of easily controlling the thickness, the application method is preferable.

In the case of the application method, a method of applying the photosensitive resin composition to the flexible substrate and the lead-out wiring part is not particularly limited, and a well-known method (for example, a coating method such as a dispenser, a gravure coater, a comma coater, a bar coater, a knife coater, a die coater, or a roll coater, an ink jet method, or a screen printing method) can be used. From the viewpoints of patterning accuracy, thickness accuracy, and manufacturing efficiency, a screen printing method is preferable.

An exposure method of a photocuring treatment is not particularly limited, and examples thereof include a method of irradiating an actinic ray or a radiation. For the irradiation with the actinic ray, light irradiation with an ultraviolet (UV) lamp or visible light is used. Examples of the light source include a mercury lamp, a metal halide lamp, a xenon lamp, a chemical lamp, and a carbon arc lamp.

In addition, examples of the radiation include an electron beam, an X-ray, an ion beam, and a far infrared ray. By exposing the coating film, a polymerizable group of compounds in the coating film is activated, the compounds are crosslinked, and the curing of the layer progresses. The exposure energy may be about 10 to 8000 $mJ/cm^2$ and is preferably in a range of 50 to 3000 $mJ/cm^2$.

Further, for frame narrowing of the touch panel, in a case where the lead-out wiring part of the conductive film is bent along the frame portion of the display device, it is preferable that the protective layer has flexibility under an outward bending condition of 2 mmϕ or less, and it is more preferable that the protective layer has flexibility under an outward bending condition of 1 mmϕ or less. In addition, in order to suppress the disconnection of the lead-out wiring part, the water permeability of the protective layer is preferably 2000 $g/m^2$/day or less and more preferably 1000 $g/m^2$/day or less. From the viewpoint of a balance between durability and flexibility, the thickness of the protective layer is preferably two times the average particle diameter of the clay mineral, and is preferably 15 μm or less. Further, the thickness of the protective layer is preferably 1 μm or more and 10 μm or less and more preferably 5 μm or more and 8 μm or less. Here, in a case where the thickness of the protective layer changes, the thickness of the protective layer refers to the thickness of the smallest portion. In a case where the thickness is less than 1 μm, durability deteriorates significantly. In a case where thickness is more than 15 μm, flexibility deteriorates and cracking is likely to occur during bending.

The clay mineral in the protective laver has a particle shape, and the average particle diameter thereof is preferably in a range of ⅕ to ½ the thickness of the protective layer. In a case where the average particle diameter is less than ⅕ the thickness of the protective layer, the flexibility of the protective layer deteriorates, cracking is likely to occur during bending. In a case where the average particle diameter is more than ½ the thickness of the protective layer, durability deteriorates significantly.

(Photosensitive Resin Composition)

<Resin Component>

In the method of manufacturing the conductive film according to the embodiment of the present invention, the photosensitive resin composition used in the step of forming the protective layer includes at least one of (meth)acrylate monomers represented by Formulae (1) and (2).

Formula (1)

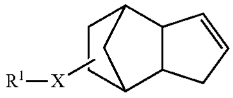

Formula (2)

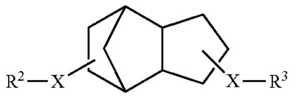

$R^1$ and $R^2$ each independently represent a (meth)acryloyl group. $R^3$ represents an unsubstituted or (meth)acryloyl group. X represents a single bond or a divalent linking group represented by Formula (3).

$$—Y^1—R^4—Y^2— \qquad \text{Formula (3)}$$

(Here, $R^4$ represents an alkylene group having 3 or less carbon atoms, and $Y^1$ and $Y^2$ each independently represent an oxygen atom or a single bond).

As the (meth)acrylate monomers represented by Formulae (1) and (2), for example, dicyclopentenyl (meth)acrylate, dicyclopentanyl (meth)acrylate, dicyclopentenyloxyethyl (meth)acrylate, or tricyclodecane dimethanol diacrylate can be used. In order to reduce the water permeability, dicyclopentenyl acrylate or tricyclodecane dimethanol diacrylate is more preferable.

In order to reduce the water permeability, the proportion of the photosensitive resin composition in the (meth)acrylate monomer is preferably 5 mass % or more, more preferably 50 mass % or more, and still more preferably 70 mass % or more.

<Other Resin Components>

In order to increase the viscosity of the photosensitive resin composition for application to a coating method such as a screen printing method described below, it is preferable that at least one of an oligomer or a polymer is included as a resin component other than the (meth)acrylate monomers. As the oligomer or the polymer, an acrylic resin, a methacrylic resin, or an epoxy resin can be used. For adhesiveness with the monomer, an acrylic resin is more preferable.

As the oligomer, a bisphenol A oligoepoxy acrylate or a bisphenol A diglycyl ether methacrylic acid adduct can be used. For adhesiveness with the monomer, a bisphenol A oligoepoxy acrylate is more preferable. In order to improve durability, the proportion of the oligomer in the photosensitive resin composition is preferably 70 mass % or less, more preferably 50 mass % or less, and still more preferably 30 mass % or less.

As the polymer, polymethyl methacrylate, polycarbonate, or polyethylene terephthalate can be used. For adhesiveness with the monomer, polymethyl methacrylate is more preferable. The proportion of the polymer in the photosensitive resin composition is preferably 10 mass % or less, more preferably 5 mass % or less, and still more preferably 3 mass % or less.

<Clay Mineral>

The photosensitive resin composition according to the embodiment of the present invention includes a particle-shaped clay mineral having an average aspect ratio of 2.0 or more. As the clay mineral, for example, talc, kaolinite, smectite, sericite, zeolite can be used. In order to reduce the water permeability, talc is more preferable.

In order to reduce the water permeability, the average particle diameter of the clay mineral is 7.5 μm or less and more preferably less than 2.5 μm. The lower limit of the average particle diameter is not particularly limited and is preferably 1.0 μm or more because disconnection caused by sulfur or halogen (in particular, iodine) occurs due to the deterioration in dispersibility in the resin component. Here, as the average particle diameter, a value of D50 calculated by measurement with a particle size distribution analyzer using a laser diffraction method can be used.

By reducing the particle diameter and increasing the aspect ratio, the distance to the metal wire increases. In particular, in a region where the thickness of the protective layer is small, the clay mineral is likely to be arranged parallel to a plane direction of the protective laver, and a synergistic effect occurs, which is preferable.

In addition, in a case where the clay mineral is used for the protective layer having a thickness of 15 μm or less, in order to prevent formation of a passage of moisture that penetrates of the protective layer in a thickness direction, the proportion of particles having a particle diameter that is more than or equal to the thickness of the protective layer is preferably 0.5 vol % or less and more preferably 0.3 vol % or less. Typically, the clay mineral is a lamellar compound. Therefore, as the particle diameter decreases due to crushing or the like, the standard deviation of the particle size distribution tends to increase, and it is preferable to perform an operation of high-precision classification such as a dry/wet sieve, elutriation, or cyclone is preferable.

In order to improve durability, the proportion of the clay mineral in the photosensitive resin composition is preferably 5 mass % to 50 mass % and more preferably 10 mass % to 30 mass %. In a case where the proportion of the clay mineral is less than 5 mass %, the effect of diverting the passage of moisture is small. In a case where the proportion of the clay mineral is more than 50 mass %, voids of the clay mineral can be sufficiently filled with the resin component.

In order to increase adhesiveness with the resin component to prevent the formation of the passage of moisture, the particle surfaces of the clay mineral are surface-modified with a silane coupling agent having a functional group crosslinkable with the resin component. Examples of the crosslinkable functional group include a (meth)acryloyl group, a vinyl group, an epoxy group, a styryl group, an amino group, an isocyanate group, and a mercapto group. For the adhesiveness with an acrylic resin, a (meth)acryloyl group is more preferable.

<Photopolymerization Initiator>

The photosensitive resin composition according to the embodiment of the present invention includes a photopolymerization initiator. The kind of the photopolymerization initiator is not particularly limited, and a well-known photopolymerization initiator (a radical photopolymerization initiator or a cationic photopolymerization initiator) can be used. Examples of the photopolymerization initiator include: a carbonyl compound such as acetophenone, 2,2-diethoxyacetophenone, p-dimethylacetophenone, p-dimethylaminopropiophenone, benzophenone, 2-chlorobenzophenone, benzyl, benzoin, benzoin methyl ether, benzoin ethyl ether, benzoin isopropyl ether, 2,2-dimethoxy-1,2-diphenylethane-1-one, 1-cyclohexylphenyl ketone, 1-hydroxy-cyclohexyl-phenyl ketone, 2-hydroxy-2-methyl-1-phenyl-propane-1-one, 1-[4-(2-hydroxyethoxy)-phenyl]-2-hydroxy-2-methyl-1-propane-1-one, oligo(2-hydroxy-2-methyl-1-(4-(1-methylvinyl)phenyl)propanone, 2-hydroxy-1-{4-[4-(2-hydroxy-2-methyl-propionyl)-benzyl]-phenyl}-2-methyl-propane-1-one, 2-methyl-1-[4-methylthiophenyl]-2-morpholinopropan-1-one, 2-benzyl-2-dimethylamino-1-(4-morpholinophenyl)-butanone-1, bis(2,4,6-trimethylbenzoyl)-phenylphosphine oxide, 2,4,6-trimethylbenzoyl-diphenyl-phosphine oxide, bis(2,6-dimethoxybenzoyl)-2,4,4-trimethyl-pentylphosphine oxide, ethyl-(2,4,6-trimethylbenzoyl)-phenylphosphinate, 1-[4-(phenylthio)]-1,2-octanedione-2-(O-benzoyloxime)], methylbenzoylformate, 4-methylbenzophenone, 4-phenylbenzophenone, 2,4,6'-trimethyl benzophenone, 4-benzoyl-4'-methyldiphenyl sulfide, 4,4'-bis(dimethylamino)benzophenone, 2,3-bornanedione, or 1-[4-(4-benzoylphenylsulfanyl)phenyl]-2-methyl-2-(4-methylphenylsulfonyl)propan-1-one; and a sulfur compound such as thioxanthone, 2-chlorothioxanthone, 2-methylthioxanthone, or tetramethylthiuram disulfide. The polymerization initiators can be used alone or in combination with two or more kinds.

The content of the photopolymerization initiator in the photosensitive resin composition is not particularly limited. From the viewpoint of curing properties, the proportion of the photopolymerization initiator in the composition for forming a transparent insulation layer is preferably 0.1 to 10 mass % and more preferably 1 to 5 mass %. In a case where two or more polymerization initiators are used, it is preferable that the total content of the polymerization initiators is in the above-described range.

In addition to the above-described components, various additive in the related art such as a metal stabilizer, a leveling agent, a surface lubricant, an antioxidant, a corrosion inhibitor, a light stabilizer, an ultraviolet absorber, or a polymerization inhibitor can be appropriately added to the photosensitive resin composition.

Basically, the present invention is configured as described above. Hereinabove, the conductive film, the touch panel, and the photosensitive resin composition according to the embodiment of the present invention have been described in detail. However, the present invention is not limited to the above-described examples, and various improvements or modifications can be made within a range not departing from the scope of the present invention.

EXAMPLES

Hereinafter, the characteristics of the present invention will be described in detail using examples. Materials, reagents, amounts thereof, proportions thereof, operations, and the like shown in the following examples can be appropriately changed as long as they do not depart from the scope of the present invention. Accordingly, the scope of the present invention is not limited to the following examples.

In the first example, photosensitive resin compositions according to Examples 1 to 24 and Comparative Examples 1 to 8 were prepared, and the viscosities thereof were measured. Further, conductive films covered with a protective layer were prepared using the photosensitive resin compositions. Regarding each of the conductive films with the protective layer, durability and flexibility described below were evaluated. The results are shown in Table 1 below.

[Evaluation]

(Viscosity Measurement of Photosensitive Resin Composition)

In order to measure the viscosity of the photosensitive resin composition, HAAKE MARS II and rheology C35-4/Ti (diameter: 35 mm, cone angle: 1°, Gap: 0.052 mm) were used, and a value of mPa·s at a rotation speed of 6 rpm at 20° C. was used.

(Durability Evaluation of Conductive Film with Protective Layer)

5 μl of potassium iodide (KI) 10% solution was added dropwise to the protective layer immediately above the lead-out wirings of the conductive film with the protective layer obtained by applying/curing the photosensitive resin composition, was naturally dried for 1 hour, and was aged for 5 days, 10 days, 15 days, and 20 days in an environment of 60° C. and 90%. Next, a rate of change in the resistance of the KI dropping section before and after the aging was measured.

Regarding each of 10 lead-out wirings on the conductive film, a resistance value between the external connection terminal corresponding to the lead-out wiring and an end part of the detection electrode was measured. A lead-out wiring where over load (OL) occurred was determined to be disconnected and was evaluated based on the following standards.

(Evaluation Standards)

AA: OL (disconnection) did not occur after aging for 20 days

A: OL (disconnection) did not occur after aging for 15 days, and OL (disconnection) occurred in one or more lead-our wirings after aging for 20 days B: OL (disconnection) did not occur after aging for 10 days, and OL (disconnection) occurred in one or more lead-our wirings after aging for 15 days C: OL (disconnection) did not occur after aging for 5 days, and OL (disconnection) occurred in one or more lead-our wirings after aging for 10 days D: OL (disconnection) occurred in one or more lead-our wirings after aging for 5 days (The evaluation C is the lower limit for use in the conductive film of the touch panel)

(Flexibility Evaluation of Conductive Film with Protective Layer)

For the conductive film with the protective layer obtained by applying/curing the photosensitive resin composition, bending tests of ϕ1.0 mm and ϕ2.0 mm were repeated 10 times using a bending test machine (DLDMLH-FS, an U-shape folding test, manufactured by Yuasa Co., Ltd.), and the bending portion after the test was observed using a microscope (type: VHX-5000, manufactured by Keyence Corporation) was observed to evaluate cracking. The number of cracks in the protective layer disposed on the outer side of bending (mountain fold) was measured and was evaluated based on the following standards.

(Evaluation Standards)

AA: cracks were not observed at ϕ1.0 mm

A: one or two cracks were observed at ϕ1.0 mm, or cracks were not observed at ϕ2.0 mm B: one or two cracks were observed at ϕ2.0 mm C: three or more cracks were observed at ϕ2.0 mm (The evaluation B is the lower limit where the conductive film can be used in a bent state)

(Particle Diameter Measurement of Clay Mineral)

The volume particle diameter was measured using a laser diffraction/scattering-type particle size distribution analyzer (LA-500, manufactured by Horiba Ltd.). As the average particle diameter, a value of D50 that was automatically calculated was measured. The proportion of particles having a particle diameter of 7 μm or more was calculated by reading the frequency of points intersecting a line having a measured cumulative curve of 7 μm.

Aspect Ratio Measurement of Clay Mineral)

In order to measure the aspect ratio, A transmission electron microscope image (FEI Titan 80-300 type transmission electron microscope, acceleration voltage: 300 kV, objective aperture: 10 mm) was obtained using a replica method, and the thickness was calculated from the diameter of a circle (equivalent circle diameter) having the same area of the projected area of each of particles and the length of a shade of the replica. The aspect ratio was obtained by obtaining the average value of measured values of 100 particles using the following calculation expression.

Aspect ratio=Equivalent Circle Diameter/Thickness

Hereinafter, Examples 1 to 17 and Comparative Examples 1 to 6 will be described.

Example 1

(Preparation of Conductive Film with Protective Layer)

(Preparation of Silver Halide Emulsion)

The following solution 2 and the following solution 3 were simultaneously added for 20 minutes to the following solution 1 held at pH 4.5 and 38° C. in amounts corresponding to 90% of the entire amounts while stirring the solutions. As a result, nuclear particles having a size of 0.16 μm were formed. Next, the following solution 4 and the following solution 5 were added for 8 minutes, and the remaining 10% amounts of the solution 2 and the solution 3 were further added for 2 minutes. As a result, the nuclear particles grew to a size of 0.21 μm. Further, 0.15 g of potassium iodide was added, and the particles were aged for 5 minutes. Then the formation of the particles was completed.

Solution 1

Water: 750 ml

Gelatin: 8.6 g

Sodium chloride: 3 g 1,3-Dimethylimidazolidine-2-thione: 20 mg

Sodium benzenethiolsulfonate: 10 mg

Citric acid: 0.7 g

Solution 2

Water: 300 ml

Silver nitrate; 150 g

Solution 3

Water: 300 ml

Sodium chloride; 38 g

Potassium bromide: 32 g

Potassium hexachloroiridate (III) (0.005% KCl 20% aqueous solution): 5 ml

Ammonium hexachlororhodate (0.001% NaCl 20% aqueous solution): 7 ml

Solution 4

Water: 100 ml

Silver nitrate: 50 g

Solution 5

Water: 100 ml

Sodium chloride: 13 g

Potassium bromide: 11 g

Yellow prussiate of potash: 5 mg

Next, the particles were cleaned with water by flocculation using an ordinary method. Specifically, the temperature was decreased to 35° C., and the pH was decreased (to be in a range of pH 3.6±0.2) using sulfuric acid until silver halide precipitated. Next, about 3 L of the supernatant liquid was removed (first water cleaning). Further, 3 L of distilled water was added, and sulfuric acid was added until silver halide precipitated. Next, about 3 L of the supernatant liquid was removed again (second water cleaning). By repeating the same operation as the second cleaning once more (third water cleaning), the water cleaning and desalting step was completed. After the water cleaning and desalting, the emulsion was adjusted to pH 6.4 and pAg 7.5, 2.5 g of gelatin, 10 mg of sodium benzenethiolsulfonate, 3 mg of sodium benzenethiosulfinate, 15 g of sodium thiosulfate, and 10 mg of chloroauric acid were added, and chemosensitization was performed at 55° C. to obtain the optimum sensitivity. Next, 100 mg of 1,3,3a,7-tetraazaindene as a stabilizer and 100 mg of PROXEL (trade name, manufactured by ICI Co., Ltd.) as a preservative were added. The finally obtained emulsion was a silver iodochlorobromide cubic particle emulsion having an average particle diameter of 0.22 μm and a coefficient of variation of 9%, in which the content of silver iodide was 0.08 mol %, and the ratio of silver chlorobromide was 70 mol % of silver chloride/30 mol % of silver bromide.

(Preparation of Composition for Forming Photosensitive Layer)

$1.2\times10^{-4}$ mol/mol Ag of 1,3,3a,7-tetraazaindene, $1.2\times10^{-2}$ mol/mol Ag of hydroquinone, $3.0\times10^{-4}$ mol/mol Ag of citric acid, 0.90 g/mol Ag of 2,4-dichloro-6-hydroxy-1,3,5-triazine sodium salt, and a small amount of a hardening agent were added to the emulsion, and the pH of the coating solution was adjusted to 5.6 using citric acid.

A polymer latex including a polymer represented by Formula (8) shown below as an example and a dispersant formed of dialkylphenyl PEO sulfuric acid ester (a mass ratio dispersant/polymer was 2.0/100=0.02) was added to the coating solution such that a mass ratio polymer/gelatin of the polymer to the gelatin in the coating solution was 0.5/1.

Further, EPOXY RESIN DY022 (trade name, manufactured by Nagase ChemteX Corporation) as a crosslinking agent was added. The addition amount of the crosslinking agent was adjusted such that the amount of the crosslinking agent in the silver halide-containing photosensitive layer described below was 0.09 $g/m^2$.

This way, the composition for forming a photosensitive layer was prepared.

The polymer represented by Formula (8) was synthesized with reference to JP3305459B and JP3754745B.

Formula (8)

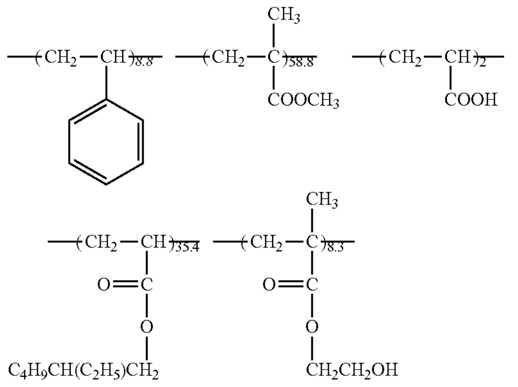

(Photosensitive Layer Forming Step)

The above-described polymer latex was applied to both surfaces of a polyethylene terephthalate (PET) film having a thickness of 40 μm to provide an undercoat layer having a thickness of 0.05 μm.

Next, a composition for forming a silver halide non-containing layer in which the polymer latex and gelatin were mixed with each other was applied to the undercoat layer to provide a silver halide non-containing layer having a thickness of 1.0 μm. The mixing mass ratio (polymer/gelatin) of the polymer to the gelatin was 2/1, and the content of the polymer was 0.65 g/$m^2$.

Next, the composition for forming a photosensitive layer was applied to the silver halide non-containing layer to provide a silver halide-containing photosensitive layer having a thickness of 2.5 μm. The mixing mass ratio (polymer/gelatin) of the polymer to the gelatin in the silver halide-containing photosensitive layer was 0.5/1, and the content of the polymer was 0.22 g/$m^2$.

Next, a composition for forming a overcoat layer in which the polymer latex and gelatin were mixed with each other was applied to the silver halide-containing photosensitive layer to provide an overcoat layer having a thickness of 0.15 μm. The mixing mass ratio (polymer/gelatin) of the polymer to the gelatin was 0.1/1, and the content of the polymer was 0.015 g/$m^2$.

(Exposure Treatment and Development Treatment)

Both surfaces of the polyethylene terephthalate (PET) film were exposed to parallel light from a high pressure mercury lamp as a light source through a photomask where the first detection electrodes and the lead-out wiring part thereof and the second detection electrodes and the lead-out wiring part thereof shown in FIG. 4 were disposed on each of the photosensitive layers.

The first detection electrodes and the lead-out wiring part thereof and the second detection electrodes and the lead-out wiring part thereof were formed on each of the surfaces of the polyethylene terephthalate film such that extending directions of the first detection electrode and the second detection electrode having a mesh shape were perpendicular to each other on both surfaces and lead-out wirings of the lead-out wiring part led out from each of the detection electrode were disposed in a peripheral region. After the exposure, the surface of the film was developed using the following developer, was developed using a fixing solution (trade name; N3X—R for CN16X, manufactured by Fuji Film Co., Ltd.), was rinsed with pure water, and then was dried.

Composition of Developer:

1 L of the developer included the following compounds.

Hydroquinone: 0.037 mol/L

N-methylamino phenol: 0.016 mol/L

Sodium metaborate: 0.140 mol/L

Sodium hydroxide: 0.360 mol/L

Sodium bromide: 0.031 mol/L

Potassium metabisulfite: 0.187 mol/L (Heating Treatment)

Further, the film was left to stand in a superheated steam bath at 120° C. for 130 seconds to heat the film.

(Gelatin Decomposition Treatment)

Further, the film was dipped in a gelatin decomposition solution (40° C.) prepared as described above for 120 seconds, was dipped in warm water (liquid temperature: 50° C.) for 120 seconds, and was cleaned.

Preparation of Gelatin Decomposition Solution

Triethanolamine and sulfuric acid were added to an aqueous solution (concentration of protease: 0.5 mass %) of protease (BIOPRASE 30 L, manufactured by Nagase ChemteX Corporation) to adjust the pH to 8.5.

(Polymer Crosslinking Treatment)

Further, the film was dipped in a CARBODILITE V-02-L2 (trade name: manufactured by Nisshinbo Chemical Inc.) 1% aqueous solution for 30 seconds, was extracted from the aqueous solution, was dipped in pure water (room temperature) for 60 seconds, and was cleaned.

This way, a film A where the detection electrodes and the lead-out wiring parts were formed on both surfaces of the PET film was obtained.

Regarding the first detection electrodes that was finally obtained, 70 electrode parts having a size of 170 mm×300 mm were arranged in parallel at intervals of 20 μm. Regarding the second detection electrodes that was finally obtained, 35 electrode parts having a size of 300 mm×170 mm were arranged in parallel at intervals of 20 μm. As shown in FIG. 8, each of the electrode parts was a layer having a unit square grid mesh shape where the length of opening portions formed of conductive fine wires was 300 μm. The line width of the conductive fine wire was 4 μm, the thickness of the conductive fine wires was 1.0 μm, and the thickness of the conductive fine wire layer was 2.0 μm.

The lead-out wiring connected to each of the electrode parts of the first detection electrodes and the second detection electrodes was integrated with the electrode part. The line width of the lead-out wirings was 30 μm, the thickness of the lead-out wirings was 1.0 μm, and the interval between the lead-out wirings was 30 μm.

(Preparation of Photosensitive Resin Composition)

The design thickness of the protective layer was determined as 7.0 μm, and 20 g of the photosensitive resin composition in total was prepared using materials shown in Table 1.

10 parts by mass of a monomer (M-1) was weighed, 1 part by mass of a photopolymerization initiator was subsequently added thereto, and the mixture was stirred using a magnetic stirrer for 1 hour. After the stirring, 79 parts by mass of an oligomer (O-1) was added, and the mixture was stirred using a AWATORI RENTARO vacuum type rotation and revolution mixer (ARV-310, manufactured by Thinky Corporation) for 3 minutes at 2000 rpm. After the stirring, 10 parts by mass of talc where the average particle diameter was 2.0 μm, the average aspect ratio was 2.3, and the proportion of particles having a particle diameter of 7.0 μm or more was 0 vol % was added, and was stirred again using the AWATORI RENTARO mixer at 2000 rpm for 3 minutes.

The kneader is not limited to the magnetic stirrer and the RENTARO mixer, and a propeller mixer, a dissolver, a homogenizer, a beads mill, a roll mill, ultrasonic waves, a planetary mixer, a kneader, or an extruder may be used. More specifically, in a case where the viscosity is 3000 mPa·s or higher, a planetary mixer, a kneader, a roll mill, or an extruder is preferable, and in a case where the viscosity is 3000 mPa·s or lower, a propeller mixer, a dissolver, a homogenizer, a beads mill, a roll mill, or ultrasonic waves are preferable.

(Protective Layer Application and Exposure Step)

The above-described photosensitive resin composition was applied to the lead-out wirings by screen printing. Next, by exposing the photosensitive resin composition to UV (metal halide lamp, 1000 mJ/cm$^2$) in the atmosphere, a protective layer (thickness: 7.0 μm) was formed to cover the lead-out wiring part of the conductive film. The protective layer was formed along a peripheral portion of the conductive film to completely cover the lead-out wirings and to cover a frame portion of the detection electrode portion.

The durability and the flexibility of the prepared conductive film with the protective layer were evaluated.

Example 2

In Example 2, a conductive film was prepared using the same method as that of Example 1, except that 20 parts by mass of the monomer (M-1) and 69 parts of the oligomer (O-1) were added.

TABLE 1

| Kind | Symbol | Product Name | Structural Formula | Molecular Weight |
|---|---|---|---|---|
| Monomer | M-1 | Dicyclopentenyloxyethyl Acrylate (FA-512AS, manufactured by ShowaDenko Materials Co., Ltd.) | 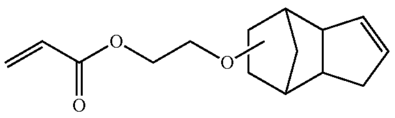 | 248 |
| | M-2 | Tricyclodecanedimethanol Diacrylate (A-DCP, manufactured by Shin-Nakamura Chemical Co, Ltd.) | 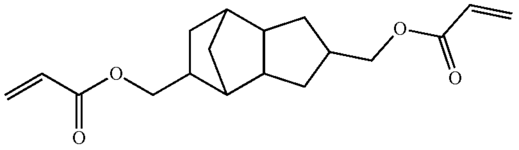 [SMILES: C=CC(=O)OCC1CC2C3CC(COC(=O)C=C)C(C3)C2C1] | 304 |
| | M-3 | Ethoxy Diethyleneglycol Acrylate (LIGHT ACRYLATE EC-A, manufactured by Kyoeisha Chemical Co., Ltd.) | 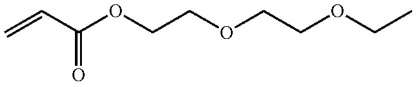 | 188 |
| Oligomer | O-1 | Bisphenol A Oligoepoxy Acrylate (manufactured by Kyoeisha Chemical Co., Ltd.) | 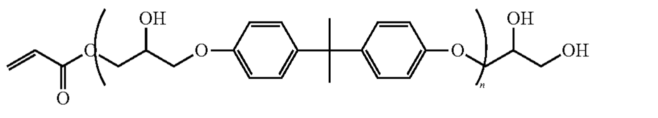 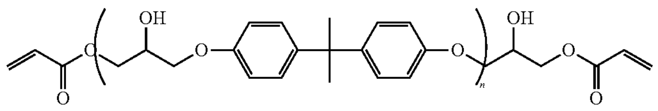 | 3000 |
| Polymer | P-1 | Polymethyl Methacrylate (Dianal BR-88, manufactured by Mitsubishi Chemical Group Corporation) | 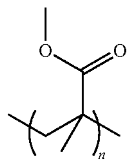 | 1300000 |
| Initiator | K-1 | Irgacure 651 (manufactured by Ciba Specialty Chemicals) | 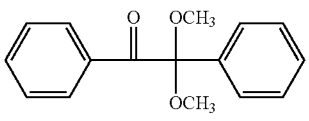 Omnirad 651 (former Irgacure 651) | 256.3 |

Example 3

In Example 3, a conductive film was prepared using the same method as that of Example 1, except that 50 parts by mass of the monomer (M-1) and 39 parts of the oligomer (O-1) were added.

Example 4

In Example 4, a conductive film was prepared using the same method as that of Example 1, except that 70 parts by mass of the monomer (M-1) and 19 parts of the oligomer (O-1) were added.

Example 5

In Example 5, a conductive film was prepared using the same method as that of Example 3, except that the talc was changed to talc where the average particle diameter was 1.4 μm, the average aspect ratio was 2.1, and the proportion of particles having a particle diameter of 7.0 μm or more was 0 vol %.

Example 6

In Example 6, a conductive film was prepared using the same method as that of Example 3, except that the talc was changed to talc where the average particle diameter was 2.3 μm, the average aspect ratio was 2.6, and the proportion of particles having a particle diameter of 7.0 μm or more was 0.1 vol %.

Example 7

In Example 7, a conductive film was prepared using the same method as that of Example 3, except that the thickness of the protective laver was changed to 9.5 μm and the talc was changed to talc where the average particle diameter was 4.0 μm, the average aspect ratio was 2.8, and the proportion of particles having a particle diameter of 9.5 μm or more was 0.3 vol %.

Example 8

In Example 8, a conductive film was prepared using the same method as that of Example 3, except that the thickness of the protective layer was changed to 14.0 μm and the talc was changed to talc where the average particle diameter was 7.0 μm, the average aspect ratio was 2.7, and the proportion of particles having a particle diameter of 14.0 μm or more was 0.4 vol %.

Example 9

In Example 9, a conductive film was prepared using the same method as that of Example 3, except that the talc was changed to talc where the average particle diameter was 2.0 μm, the average aspect ratio was 2.4, and the proportion of particles having a particle diameter of 7.0 μm or more was 0.5 vol %.

Example 101

In Example 10, a conductive film was prepared using the same method as that of Example 2, except that 74 parts by mass of the oligomer (O-1) and 5 parts by mass of the talc were added.

Example 11

In Example 11, a conductive film was prepared using the same method as that of Example 2, except that 59 parts by mass of the oligomer (O-1) and 20 parts by mass of the talc were added.

Example 12

In Example 12, a conductive film was prepared using the same method as that of Example 2, except that 49 parts by mass of the oligomer (O-1) and 30 parts by mass of the talc were added.

Example 13

In Example 13, a conductive film was prepared using the same method as that of Example 2, except that 29 parts by mass of the oligomer (O-1) and 50 parts by mass of the talc were added.

Example 14

In Example 14, a conductive film was prepared using the same method as that of Example 2, except that the talc was changed to talc that was surface-modified with a silane coupling agent having an acryloyl group.

Example 15

In Example 15, a conductive film was prepared using the same method as that of Example 2, except that the talc was changed to talc that was surface-modified with a silane coupling agent having an isocyanate group.

Example 16

In Example 16, a conductive film was prepared using the same method as that of Example 14, except that the thickness of the protective layer was changed to 8.0 μm.

Example 17

In Example 17, a conductive film was prepared using the same method as that of Example 14, except that the thickness of the protective layer was changed to 6.0 μm.

Example 18

In Example 18, a conductive film was prepared using the same method as that of Example 14, except that the thickness of the protective layer was changed to 5.0 μm.

Example 19

In Example 19, a conductive film was prepared using the same method as that of Example 14, except that 79 parts by mass of a monomer (M-2) was added, the oligomer was not added, and 20 parts by mass of the talc was added.

Example 201

In Example 20, a conductive film was prepared using the same method as that of Example 19, except that 78 parts by mass of the monomer (M-2) and 1 part by mass of a polymer (P-1) were added.

Example 21

In Example 21, a conductive film was prepared using the same method as that of Example 19, except that 76 parts by mass of the monomer (M-2) and 3 parts by mass of the polymer (P-1) were added.

Example 22

In Example 22, a conductive film was prepared using the same method as that of Example 19, except that 74 parts by mass of the monomer (M-2) and 5 part by mass of the polymer (P-1) were added.

Example 23

In Example 23, a conductive film was prepared using the same method as that of Example 20, except that the thickness of the protective layer was changed to 9.5 μm and the talc was changed to talc where the average particle diameter was 4.0 μm, the average aspect ratio was 2.8, and the proportion of particles having a particle diameter of 9.5 μm or more was 0.3 vol % and that was surface-modified with a silane coupling agent having an acryloyl group.

Example 24

In Example 24, a conductive film was prepared using the same method as that of Example 20, except that the thickness of the protective layer was changed to 14.0 μm and the talc was changed to talc where the average particle diameter was 7.0 μm, the average aspect ratio was 2.7, and the proportion of particles having a particle diameter of 14.0 μm or more was 0.4 vol % and that was surface-modified with a silane coupling agent having an acryloyl group.

Comparative Example 1

In Comparative Example 1, a conductive film was prepared using the same method as that of Example 2, except that 79 parts by mass of the oligomer (O-1) was added and the talc was not added.

Comparative Example 2

In Comparative Example 2, a conductive film was prepared using the same method as that of Example 2, except that the talc was changed to talc where the average particle diameter was 1.2 μm, the average aspect ratio was 2.0, and the proportion of particles having a particle diameter of 7.0 μm or more was 0 vol %.

Comparative Example 3

In Comparative Example 3, a conductive film was prepared using the same method as that of Example 2 except that the talc was changed to talc where the average particle diameter was 3.7 μm, the average aspect ratio was 2.5, and the proportion of particles having a particle diameter of 7.0 μm or more was 0.4 vol %.

Comparative Example 4

In Comparative Example 4, a conductive film was prepared using the same method as that of Example 2 except that the monomer was changed to a monomer (M-3).

Comparative Example 5

In Comparative Example 5, a conductive film was prepared using the same method as that of Example 3, except that the thickness of the protective layer was changed to 5.0 μm and the talc was changed to talc where the average particle diameter was 2.4 μm, the average aspect ratio was 2.7, and the proportion of particles having a particle diameter of 5.0 μm or more was 0.6 vol %.

Comparative Example 6

In Comparative Example 6, a conductive film was prepared using the same method as that of Example 2, except that the talc was changed to talc where the average particle diameter was 2.0 μm, the average aspect ratio was 1.5, and the proportion of particles having a particle diameter of 7 μm or more was 0 vol %.

Comparative Example 7

In Comparative Example 7, a conductive film was prepared using the same method as that of Example 8, except that the thickness of the protective layer was changed to 16.0 μm.

Comparative Example 8

In Comparative Example 8, a conductive film was prepared using the same method as that of Example 24, except that the thickness of the protective layer was changed to 16.0 μm.

Table 2 shows the configurations and the evaluation results of the conductive films according to Comparative Examples.

TABLE 2

| | Resin Component | | | | | | | |
|---|---|---|---|---|---|---|---|---|
| | Monomer | | Oligomer | | Polymer | | Initiator | |
| | Kind | Proportion (wt %) | Kind | Propostion (wt %) | Kind | Proportion (wt %) | Kind | Proportion (wt %) |
| Example 1 | M-1 | 10 | O-1 | 79 | | | K-1 | 1 |
| Example 2 | M-1 | 20 | O-1 | 69 | | | K-1 | 1 |
| Example 3 | M-1 | 50 | O-1 | 39 | | | K-1 | 1 |
| Example 4 | M-1 | 70 | O-1 | 19 | | | K-1 | 1 |
| Example 5 | M-1 | 50 | O-1 | 39 | | | K-1 | 1 |
| Example 6 | M-1 | 50 | O-1 | 39 | | | K-1 | 1 |
| Example 7 | M-1 | 50 | O-1 | 39 | | | K-1 | 1 |
| Example 8 | M-1 | 50 | O-1 | 39 | | | K-1 | 1 |
| Example 9 | M-1 | 50 | O-1 | 39 | | | K-1 | 1 |

TABLE 2-continued

| | | | | | | | | |
|---|---|---|---|---|---|---|---|---|
| Example 10 | M-1 | 20 | O-1 | 74 | | | K-1 | 1 |
| Example 11 | M-1 | 20 | O-1 | 59 | | | K-1 | 1 |
| Example 12 | M-1 | 20 | O-1 | 49 | | | K-1 | 1 |
| Example 13 | M-1 | 20 | O-1 | 29 | | | K-1 | 1 |
| Example 14 | M-1 | 20 | O-1 | 69 | | | K-1 | 1 |
| Example 15 | M-1 | 20 | O-1 | 69 | | | K-1 | 1 |
| Example 16 | M-1 | 20 | O-1 | 69 | | | K-1 | 1 |
| Example 17 | M-1 | 20 | O-1 | 69 | | | K-1 | 1 |
| Example 18 | M-1 | 20 | O-1 | 69 | | | K-1 | 1 |
| Example 19 | M-2 | 79 | | | | | K-1 | 1 |
| Example 20 | M-2 | 78 | | | P-1 | 1 | K-1 | 1 |
| Example 21 | M-2 | 76 | | | P-1 | 3 | K-1 | 1 |
| Example 22 | M-2 | 74 | | | P-1 | 5 | K-1 | 1 |
| Example 23 | M-2 | 78 | | | P-1 | 1 | K-1 | 1 |
| Example 24 | M-2 | 78 | | | P-1 | 1 | K-1 | 1 |
| Comparative example 1 | M-1 | 20 | O-1 | 79 | | | K-1 | 1 |
| Comparative example 2 | M-1 | 20 | O-1 | 69 | | | K-1 | 1 |
| Comparative example 3 | M-1 | 20 | O-1 | 69 | | | K-1 | 1 |
| Comparative example 4 | M-3 | 20 | O-1 | 69 | | | K-1 | 1 |
| Comparative example 5 | M-1 | 50 | O-1 | 39 | | | K-1 | 1 |
| Comparative example 6 | M-1 | 20 | O-1 | 69 | | | K-1 | 1 |
| Comparative example 7 | M-1 | 50 | O-1 | 39 | | | K-1 | 1 |
| Comparative example 8 | M-2 | 78 | | | P-1 | 1 | K-1 | 1 |

| | Cray Mineral (Talc) | | | | | | | | |
|---|---|---|---|---|---|---|---|---|---|
| | D50 (μm) | Aspect Ratio | Proportion of Particles having Particle Diameter of Thickness or More | Surface Modification | Proportion (wt %) | Protective Layer Thickness (μm) | Durability | Flexbility | Viscosity (mPa · s) |
| Example 1 | 2 0 | 2.3 | 0.0 | | 10 | 7.0 | B | AA | 11100 |
| Example 2 | 2.0 | 2.3 | 0.0 | | 10 | 7.0 | A | AA | 9700 |
| Example 3 | 2.0 | 2.3 | 0.0 | | 10 | 7.0 | A | AA | 8500 |
| Example 4 | 2.0 | 2.3 | 0.0 | | 10 | 7.0 | A | AA | 7100 |
| Example 5 | 1.4 | 2.1 | 0.0 | | 10 | 7.0 | C | AA | 9000 |
| Example 6 | 2.3 | 2.6 | 0.1 | | 10 | 7.0 | A | AA | 9400 |
| Example 7 | 4.0 | 2.8 | 0.3 | | 10 | 9.5 | B | A | 10500 |
| Example 8 | 7.0 | 2.7 | 0.4 | | 10 | 14.0 | C | B | 11300 |
| Example 9 | 2.0 | 2.4 | 0.5 | | 10 | 7.0 | C | AA | 9600 |
| Example 10 | 2.0 | 2.3 | 0.0 | | 5 | 7.0 | B | AA | 9800 |
| Example 11 | 2.0 | 2.3 | 0.0 | | 20 | 7.0 | A | AA | 10100 |
| Example 12 | 2.0 | 2.3 | 0.0 | | 30 | 7.0 | A | A | 10400 |
| Example 13 | 2.0 | 2.3 | 0.0 | Acryl | 50 | 7.0 | C | B | 10700 |
| Example 14 | 2.0 | 2.3 | 0.0 | Isocyanate | 10 | 7.0 | AA | AA | 9600 |
| Example 15 | 2.0 | 2.3 | 0.0 | Acryl | 10 | 7 0 | A | AA | 9500 |
| Example 16 | 2.0 | 2.3 | 0.0 | Acryl | 10 | 8.0 | AA | A | 9700 |
| Example 17 | 2 0 | 2.3 | 0.1 | Acryl | 10 | 6.0 | A | AA | 9700 |
| Example 18 | 2.0 | 2.3 | 0.2 | Acryl | 10 | 5.0 | B | AA | 9700 |
| Example 19 | 2.0 | 2.3 | 0.0 | Acryl | 20 | 7.0 | AA | A | 5200 |
| Example 20 | 2.0 | 2.3 | 0.0 | Acryl | 20 | 7 0 | AA | AA | 9800 |
| Example 21 | 2.0 | 2.3 | 0.0 | Acryl | 20 | 7.0 | AA | AA | 13500 |
| Example 22 | 2 0 | 2.3 | 0.0 | Acryl | 20 | 7.0 | AA | AA | 15400 |
| Example 23 | 4.0 | 2.8 | 0.3 | Acryl | 20 | 9.5 | A | A | 10600 |
| Example 24 | 7.0 | 2.7 | 0.4 | Acryl | 20 | 14.0 | B | B | 11500 |
| Comparative example 1 | | | | | | 7.0 | D | A | 9300 |
| Comparative example 2 | 1.2 | 2.0 | 0.0 | | 10 | 7 0 | D | A | 8400 |
| Comparative example 3 | 3.7 | 2.5 | 0.4 | | 10 | 7.0 | D | A | 9900 |
| Comparative example 4 | 2.0 | 2.3 | 0.0 | | 10 | 7.0 | D | A | 13200 |
| Comparative example 5 | 2.4 | 2.9 | 0.6 | Acryl | 10 | 5.0 | D | A | 9500 |
| Comparative example 6 | 2.0 | 1.5 | 0.0 | | 10 | 7.0 | D | B | 9200 |
| Comparative example 7 | 7.0 | 2.7 | 0.3 | | 10 | 16.0 | C | C | 11300 |

TABLE 2-continued

| | | | | | | | | | |
|---|---|---|---|---|---|---|---|---|---|
| Comparative example 8 | 7.0 | 2.7 | 0.3 | | 20 | 16.0 | B | C | 11500 |

It can be seen from Examples and Comparative Examples that, in a case where the (meth)acrylate monomers represented by Formulae (1) and (2) are not included or talc having an average particle diameter that was less than 1.5 or more than ½ the thickness of the protective layer, talc where the proportion of particles having a particle diameter that was less than or equal to the thickness of the protective layer was more than 0.5 vol %, or talc having an average aspect ratio of less than 2.0 is used, the durability of the conductive film is significantly low. Further, it can be seen that, in a case where the thickness of the protective layer is more than 1.5 μm, the number of cracks increases. An increase in the number of cracks accelerates corrosion of wirings in a bending portion, which is not preferable.

It was found that, in the range of the present invention, durability and flexibility can be improved simultaneously, and in particular, in a case where talc where the average particle diameter is less than 2.5 μm and the thickness of the protective layer is 8 μm or less and that is surface-modified with a silane coupling agent crosslinkable with a resin component is used, durability and flexibility can be improved at a high level simultaneously.

EXPLANATION OF REFERENCES

10; touch panel
11: conductive film
12: image display module
13: controller
14: polarizing plate
15: cover portion
16: decorative layer
17*a*: first transparent insulation layer
17*b*: second transparent insulation layer
17*c*: third transparent insulation layer
18: protective layer
19: flexible circuit board
20: detection unit
21: transparent flexible substrate
21*a*: front surface
21*b*: rear surface
22: lead-out wiring part
23: lead-out wiring
24: external connection terminal
25: bending portion
30: first detection electrode
31: interval
32: second detection electrode
33: fine metal wire
34: detection electrode
35: opening portion
50: conductive wire
52: binder
54: metal portion

What is claimed is:

1. A conductive film comprising:

a fine metal wire that is provided on at least one surface of a transparent flexible substrate, wherein at least a part of the fine metal wire is covered with a protective layer obtained by curing a photosensitive resin composition including a resin forming component that includes at least one of (meth)acrylate monomers represented by Formulae (1) and (2), a clay mineral, and a photopolymerization initiator, a thickness (t) of the protective layer is 15 μm or less, an average particle diameter ($D_{ave}$) of the clay mineral is ⅕ to ½ the thickness (t) of the protective layer and an average aspect ratio of the clay mineral is 2.0 or more, a proportion of the clay mineral having a particle diameter that is more than or equal to the thickness (t) of the protective layer is 0.5 vol % or less, and a proportion of the clay mineral in the photosensitive resin composition is 5 to 50 mass %, Formula (1)

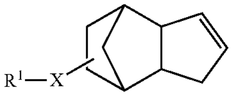

Formula (2)

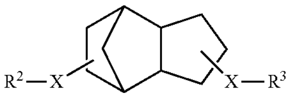

$R^1$ and $R^2$ each independently represent a (meth)acryloyl group, $R^3$ represents an unsubstituted or (meth)acryloyl group, and X represents a single bond or a divalent linking group represented by Formula (3), $$—Y^1—R^4—Y^2— \quad \text{Formula (3)}$$

$R^4$ represents an alkylene group having 3 or less carbon atoms, and $Y^1$ and $Y^2$ each independently represent an oxygen atom or a single bond.

2. The conductive film according to claim 1, wherein the average particle diameter ($D_{ave}$) of the clay mineral is less than 2.5 μm, and the thickness (t) of the protective layer is 8 μm or less.

3. The conductive film according to claim 1, wherein a content of the clay mineral in the photosensitive resin composition is 10 to 30 mass %.

4. The conductive film according to claim 1, wherein the clay mineral is a talc that is surface-modified with a silane coupling agent having a functional group crosslinkable with the resin forming component.

5. The conductive film according to claim 4, wherein the functional group is at least one selected from the group consisting of a (meth)acryloyl group, a vinyl group, an epoxy group, a styryl group, an amino group, a mercapto group, and an isocyanate group.

6. The conductive film according to claim 1, wherein the resin forming component further includes an oligomer and/or a polymer.

7. The conductive film according to claim 6, wherein the oligomer and the polymer are (meth) acrylates.

8. A conductive film comprising:

a fine metal wire that is provided on at least one surface of a transparent flexible substrate, wherein a protective layer including a resin component having a dicyclopentenyl structure or a tricyclodecane structure and a clay mineral is laminated on at least a part of the fine metal wire, a thickness (t) of the protective layer is 15 μm or less, an average particle diameter ($D_{ave}$) of the clay mineral is ⅕ to ½ the thickness (t) of the protective layer and an average aspect ratio of the clay mineral is 2.0 or more, a proportion of the clay mineral having a particle diameter that is more than or equal to the thickness (t) of the protective layer is 0.5 vol % or less, and a proportion of the clay mineral in the protective layer is 5 to 50 mass %.

9. The conductive film according to claim 8, wherein the average particle diameter ($D_{ave}$) of the clay mineral is less than 2.5 μm, and the thickness (t) of the protective layer is 8 μm or less.

10. A touch panel comprising, in the following order:

an image display module;

the conductive film according to claim 1; and a cover portion, wherein the conductive film is disposed on a display surface side of the image display module, and a polarizing plate is further disposed at at least any one of a position between the image display module and the conductive film or a position between the conductive film and the cover portion.

11. The touch panel according to claim 10, comprising:

a lead-out wiring part that includes the fine metal wire, and at least a part of the lead-out wiring part is bent along a frame portion of the image display module.

12. A touch panel comprising, in the following order:

an image display module;

the conductive film according to claim 8; and a cover portion, wherein the conductive film is disposed on a display surface side of the image display module, and a polarizing plate is further disposed at at least any one of a position between the image display module and the conductive film or a position between the conductive film and the cover portion.

13. The touch panel according to claim 12, comprising:

a lead-out wiring part that includes the fine metal wire, and at least a part of the lead-out wiring part is bent along a frame portion of the image display module.

14. A photosensitive resin composition comprising:

a resin forming component that includes at least one of (meth)acrylate monomers represented by Formulae (1) and (2);

a clay mineral that has an average particle diameter ($D_{ave}$) of 7.5 μm or less and an average aspect ratio of 2.0 or more and is surface-modified with a silane coupling agent having a functional group crosslinkable with the resin forming component; and a photopolymerization initiator, wherein a viscosity of the photosensitive resin composition is 5000 mPa·s or higher, and a proportion of the clay mineral in the photosensitive resin composition is 5 to 50 mass %, Formula (1)

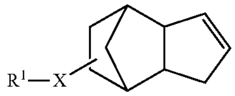

Formula (2)

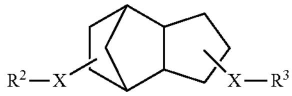

$R^1$ and $R^2$ each independently represent a (meth)acryloyl group, $R^3$ represents an unsubstituted or (meth)acryloyl group, and X represents a single bond or a divalent linking group represented by Formula (3), $$—Y^1—R^4—Y^2— \qquad \text{Formula (3)}$$

$R^4$ represents an alkylene group having 3 or less carbon atoms, and $Y^1$ and $Y^2$ each independently represent an oxygen atom or a single bond.

15. The photosensitive resin composition according to claim 14, wherein the average particle diameter ($D_{ave}$) of the clay mineral is less than 2.5 μm.

* * * * *